(12) United States Patent
Kozuma

(10) Patent No.: US 9,755,648 B2
(45) Date of Patent: Sep. 5, 2017

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Munehiro Kozuma, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/542,874

(22) Filed: Nov. 17, 2014

(65) Prior Publication Data

US 2015/0145559 A1    May 28, 2015

(30) Foreign Application Priority Data

Nov. 22, 2013 (JP) ................................ 2013-241441

(51) Int. Cl.
*H03K 19/177* (2006.01)
*H01L 27/12* (2006.01)
(Continued)

(52) U.S. Cl.
CPC .......... *H03K 19/1776* (2013.01); *G11C 7/20* (2013.01); *H01L 27/0688* (2013.01);
(Continued)

(58) Field of Classification Search
None
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2006, vol. 26, pp. 181-184.
(Continued)

*Primary Examiner* — Crystal L Hammond
(74) *Attorney, Agent, or Firm* — Fish & Richardson P.C.

(57) ABSTRACT

To provide a highly reliable and low-power-consumption semiconductor device functioning as a programmable logic device. A monitor circuit is provided to monitor a change in the potential of a configuration memory in which a transistor is turned off to hold charge and a potential corresponding to the charge is stored as configuration data. The reset of the configuration data is controlled in accordance with the potential change. With such a structure, the configuration memory can be reconfigured before the configuration data is lost, resulting in improved reliability of the semiconductor device. In addition, reconfiguration can be performed every time data is lost. Accordingly, power consumption can be reduced as compared with the structure where reconfiguration is performed periodically.

17 Claims, 30 Drawing Sheets

(51) Int. Cl.
*H01L 29/786* (2006.01)
*H01L 27/06* (2006.01)
*H01L 29/78* (2006.01)
*H01L 27/092* (2006.01)
*H01L 27/1156* (2017.01)
*G11C 7/20* (2006.01)
*G11C 29/44* (2006.01)

(52) U.S. Cl.
CPC ........ *H01L 27/092* (2013.01); *H01L 27/1156* (2013.01); *H01L 29/785* (2013.01); *H01L 29/7869* (2013.01); *G11C 2029/4402* (2013.01); *H01L 27/1225* (2013.01)

(56) References Cited

U.S. PATENT DOCUMENTS

| | | | | |
|---|---|---|---|---|
| 6,107,821 A * | 8/2000 | Kelem | ............. | H03K 19/17752 326/38 |
| 6,255,849 B1 * | 7/2001 | Mohan | ............. | H03K 19/17752 326/38 |
| 6,294,274 B1 | 9/2001 | Kawazoe et al. | | |
| 6,563,174 B2 | 5/2003 | Kawasaki et al. | | |
| 6,625,057 B2 * | 9/2003 | Iwata | ............. | B82Y 10/00 365/158 |
| 6,687,804 B1 * | 2/2004 | Kosaki | ............. | G06F 3/0607 711/115 |
| 6,727,522 B1 | 4/2004 | Kawasaki et al. | | |
| 7,049,190 B2 | 5/2006 | Takeda et al. | | |
| 7,061,014 B2 | 6/2006 | Hosono et al. | | |
| 7,064,346 B2 | 6/2006 | Kawasaki et al. | | |
| 7,105,868 B2 | 9/2006 | Nause et al. | | |
| 7,211,825 B2 | 5/2007 | Shih et al | | |
| 7,282,782 B2 | 10/2007 | Hoffman et al. | | |
| 7,297,977 B2 | 11/2007 | Hoffman et al. | | |
| 7,323,356 B2 | 1/2008 | Hosono et al. | | |
| 7,340,597 B1 * | 3/2008 | Cheriton | ............. | G06F 21/554 713/100 |
| 7,385,224 B2 | 6/2008 | Ishii et al. | | |
| 7,402,506 B2 | 7/2008 | Levy et al. | | |
| 7,411,209 B2 | 8/2008 | Endo et al. | | |
| 7,453,065 B2 | 11/2008 | Saito et al. | | |
| 7,453,087 B2 | 11/2008 | Iwasaki | | |
| 7,462,862 B2 | 12/2008 | Hoffman et al. | | |
| 7,468,304 B2 | 12/2008 | Kaji et al. | | |
| 7,501,293 B2 | 3/2009 | Ito et al. | | |
| 7,626,418 B1 * | 12/2009 | Kolze | ............. | H03K 19/17732 326/39 |
| 7,674,650 B2 | 3/2010 | Akimoto et al. | | |
| 7,732,819 B2 | 6/2010 | Akimoto et al. | | |
| 7,917,820 B1 * | 3/2011 | Pavle | ............. | G01R 31/31859 714/718 |
| 8,019,950 B1 * | 9/2011 | Warshofsky | ............. | G06F 13/00 710/310 |
| 8,675,382 B2 | 3/2014 | Kurokawa | | |
| 8,683,166 B1 * | 3/2014 | Flateau, Jr. | ............. | H03K 19/17736 711/154 |
| 2001/0046027 A1 | 11/2001 | Tai et al. | | |
| 2002/0056838 A1 | 5/2002 | Ogawa | | |
| 2002/0089024 A1 * | 7/2002 | Iwata | ............. | B82Y 10/00 257/421 |
| 2002/0132454 A1 | 9/2002 | Ohtsu et al. | | |
| 2002/0169908 A1 * | 11/2002 | Shiraga | ............. | G06F 13/362 710/240 |
| 2003/0189401 A1 | 10/2003 | Kido et al. | | |
| 2003/0218222 A1 | 11/2003 | Wager, III et al. | | |
| 2004/0038446 A1 | 2/2004 | Takeda et al. | | |
| 2004/0127038 A1 | 7/2004 | Carcia et al. | | |
| 2005/0017302 A1 | 1/2005 | Hoffman et al. | | |
| 2005/0199959 A1 | 9/2005 | Chiang et al. | | |
| 2006/0035452 A1 | 2/2006 | Carcia et al. | | |
| 2006/0043377 A1 | 3/2006 | Hoffman et al. | | |
| 2006/0091793 A1 | 5/2006 | Baude et al. | | |
| 2006/0106954 A1 * | 5/2006 | Woodbridge | ............. | G06F 13/385 710/15 |
| 2006/0108529 A1 | 5/2006 | Saito et al. | | |
| 2006/0108636 A1 | 5/2006 | Sano et al. | | |
| 2006/0110867 A1 | 5/2006 | Yabuta et al. | | |
| 2006/0113536 A1 | 6/2006 | Kumomi et al. | | |
| 2006/0113539 A1 | 6/2006 | Sano et al. | | |
| 2006/0113549 A1 | 6/2006 | Den et al. | | |
| 2006/0113565 A1 | 6/2006 | Abe et al. | | |
| 2006/0169973 A1 | 8/2006 | Isa et al. | | |
| 2006/0170111 A1 | 8/2006 | Isa et al. | | |
| 2006/0197092 A1 | 9/2006 | Hoffman et al. | | |
| 2006/0208977 A1 | 9/2006 | Kimura | | |
| 2006/0228974 A1 | 10/2006 | Thelss et al. | | |
| 2006/0231882 A1 | 10/2006 | Kim et al. | | |
| 2006/0238135 A1 | 10/2006 | Kimura | | |
| 2006/0244107 A1 | 11/2006 | Sugihara et al. | | |
| 2006/0284171 A1 | 12/2006 | Levy et al. | | |
| 2006/0284172 A1 | 12/2006 | Ishii | | |
| 2006/0292777 A1 | 12/2006 | Dunbar | | |
| 2007/0024187 A1 | 2/2007 | Shin et al. | | |
| 2007/0046191 A1 | 3/2007 | Saito | | |
| 2007/0052025 A1 | 3/2007 | Yabuta | | |
| 2007/0054507 A1 | 3/2007 | Kaji et al. | | |
| 2007/0090365 A1 | 4/2007 | Hayashi et al. | | |
| 2007/0108446 A1 | 5/2007 | Akimoto | | |
| 2007/0152217 A1 | 7/2007 | Lai et al. | | |
| 2007/0172591 A1 | 7/2007 | Seo et al. | | |
| 2007/0187678 A1 | 8/2007 | Hirao et al. | | |
| 2007/0187760 A1 | 8/2007 | Furuta et al. | | |
| 2007/0194379 A1 | 8/2007 | Hosono et al. | | |
| 2007/0252928 A1 | 11/2007 | Ito et al. | | |
| 2007/0272922 A1 | 11/2007 | Kim et al. | | |
| 2007/0287296 A1 | 12/2007 | Chang | | |
| 2008/0006877 A1 | 1/2008 | Mardilovich et al. | | |
| 2008/0038882 A1 | 2/2008 | Takechi et al. | | |
| 2008/0038929 A1 | 2/2008 | Chang | | |
| 2008/0050595 A1 | 2/2008 | Nakagawara et al. | | |
| 2008/0073653 A1 | 3/2008 | Iwasaki | | |
| 2008/0083950 A1 | 4/2008 | Pan et al. | | |
| 2008/0106191 A1 | 5/2008 | Kawase | | |
| 2008/0128689 A1 | 6/2008 | Lee et al. | | |
| 2008/0129195 A1 | 6/2008 | Ishizaki et al. | | |
| 2008/0150579 A1 * | 6/2008 | Madurawe | ......... | H03K 19/1735 326/38 |
| 2008/0166834 A1 | 7/2008 | Kim et al. | | |
| 2008/0182358 A1 | 7/2008 | Cowdery-Corvan et al. | | |
| 2008/0224133 A1 | 9/2008 | Park et al. | | |
| 2008/0254569 A1 | 10/2008 | Hoffman et al. | | |
| 2008/0258139 A1 | 10/2008 | Ito et al. | | |
| 2008/0258140 A1 | 10/2008 | Lee et al. | | |
| 2008/0258141 A1 | 10/2008 | Park et al. | | |
| 2008/0258143 A1 | 10/2008 | Kim et al. | | |
| 2008/0296568 A1 | 12/2008 | Ryu et al. | | |
| 2009/0068773 A1 | 3/2009 | Lai et al. | | |
| 2009/0073325 A1 | 3/2009 | Kuwabara et al. | | |
| 2009/0114910 A1 | 5/2009 | Chang | | |
| 2009/0134399 A1 | 5/2009 | Sakakura et al. | | |
| 2009/0152506 A1 | 6/2009 | Umeda et al. | | |
| 2009/0152541 A1 | 6/2009 | Maekawa et al. | | |
| 2009/0278122 A1 | 11/2009 | Hosono et al. | | |
| 2009/0280600 A1 | 11/2009 | Hosono et al. | | |
| 2010/0065844 A1 | 3/2010 | Tokunaga | | |
| 2010/0092800 A1 | 4/2010 | Itagaki et al. | | |
| 2010/0109002 A1 | 5/2010 | Itagaki et al. | | |
| 2011/0141825 A1 * | 6/2011 | Hatanaka | ............. | G11C 11/417 365/189.07 |
| 2011/0233540 A1 * | 9/2011 | Yamazaki | ......... | H01L 29/78606 257/43 |
| 2012/0286822 A1 * | 11/2012 | Madurawe | .......... | G06F 17/5068 326/41 |
| 2013/0027079 A1 * | 1/2013 | Nazarian | ............. | H01L 27/101 326/41 |
| 2013/0293263 A1 * | 11/2013 | Kurokawa | ......... | H03K 19/094 326/41 |

(56) References Cited

U.S. PATENT DOCUMENTS

| | | | |
|---|---|---|---|
| 2013/0321025 A1* | 12/2013 | Kurokawa | H03K 19/177 326/41 |
| 2014/0159771 A1* | 6/2014 | Ikeda | H03K 19/0016 326/41 |
| 2014/0368235 A1* | 12/2014 | Aoki | H03K 19/0013 326/38 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-194940 | 8/2007 |
| JP | 2012-186797 A | 9/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H at al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J at al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Beinding Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn]at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H at al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure". IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest. 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 30, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

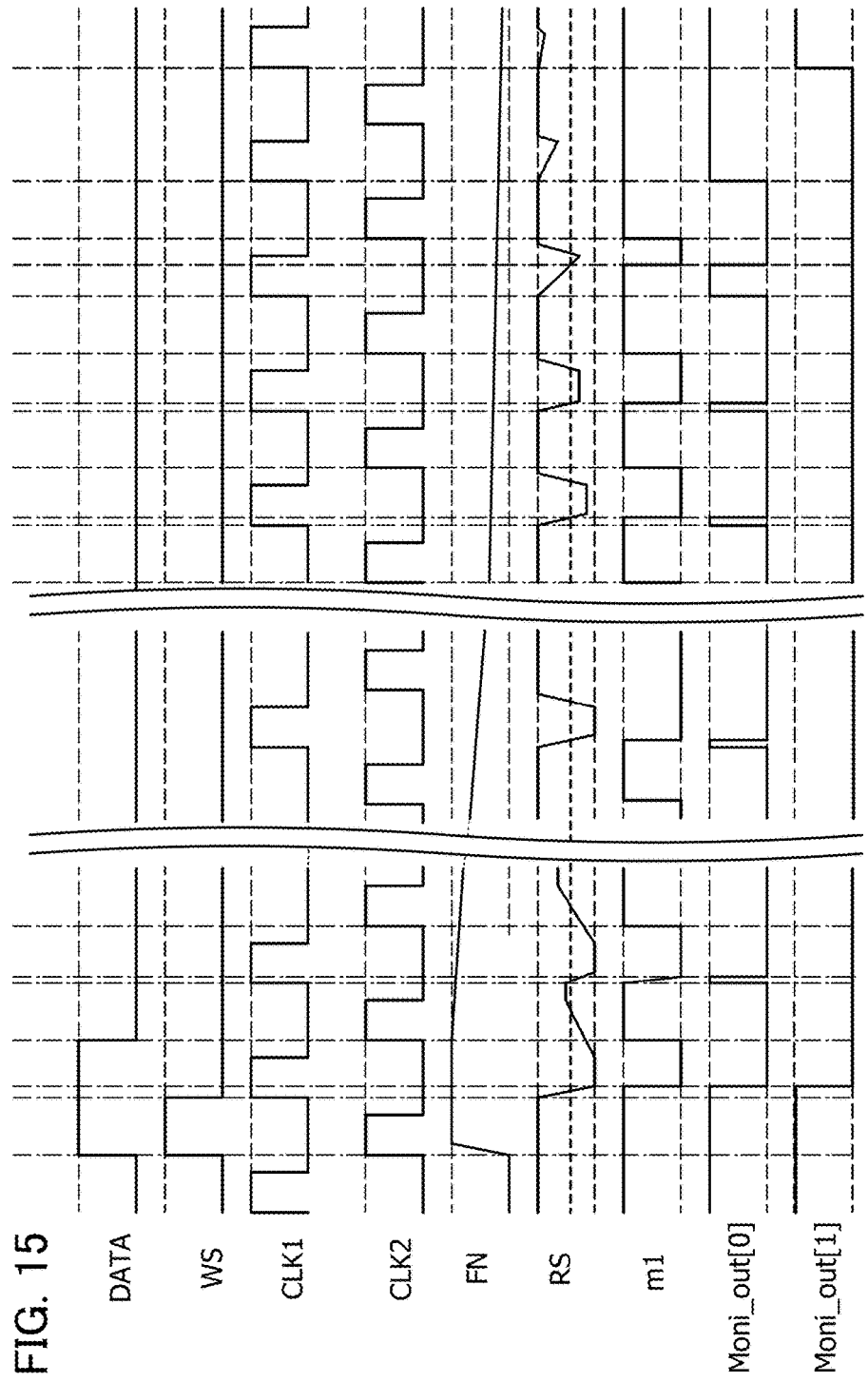

CAAC-OS nc-OS

□ Proportion of non-CAAC   ▨ Proportion of CAAC

As-sputtered

After heat treatment at 450 °C

SEMICONDUCTOR DEVICE

BACKGROUND OF THE INVENTION

1. Field of the Invention

The present invention relates to, for example, a semiconductor device. In particular, one embodiment of the present invention relates to a semiconductor device having a function as a programmable logic device.

Note that the present invention is not limited to the above technical field. The technical field of the invention disclosed in this specification and the like relates to an object, a method, or a manufacturing method. In addition, the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

A programmable logic device (PLD) is a semiconductor device that includes a plurality of programmable logic elements (PLEs) and a plurality of programmable switch elements (PSEs). In the PLD, the function of each PLE or the connection between the PLEs that is established with the PSE can be changed by programming performed by a user after manufacture, so that the circuit structure and function of the PLD can be changed.

Configuration data for setting a function of a PLE and a connection established with a PSE is stored in a configuration memory. In the configuration memory of the semiconductor device functioning as a PLD, which has attracted attention, a transistor using silicon (Si) for a semiconductor layer (hereinafter referred to as a Si transistor) is combined with a transistor using an oxide semiconductor (OS) for a semiconductor layer (hereinafter referred to as an OS transistor), so that charge is held and a potential corresponding to the charge is stored as configuration data (see Patent Document 1).

REFERENCE

Patent Document

[Patent Document 1] Japanese Published Patent Application No. 2012-186797

SUMMARY OF THE INVENTION

In the case of using a configuration memory in which charge is held and a potential corresponding to the charge is stored as configuration data, a transistor for holding the charge needs to have an off-state current as low as 1 zA ($1\times10^{-21}$ A) or less. Owing to an increasing number of transistors in a semiconductor device and the demand for power saving, miniaturization of transistors is required. The off-state current of transistors increases with the miniaturization thereof, which causes a change in the potential corresponding to the stored configuration data. Accordingly, in the configuration memory, the configuration data needs to be reset periodically (reconfiguration).

However, in the case where reconfiguration is periodically performed at a short interval, unnecessary reconfiguration is performed even though data is not changed or lost, and power consumption increases. In contrast, in the case where reconfiguration is performed at a long interval, data is changed or lost leading to lower reliability of data output from the semiconductor device.

In view of the above, an object of one embodiment of the present invention is to provide a semiconductor device or the like with a novel structure in which unnecessary reconfiguration is not performed. Another object of one embodiment of the present invention is to provide a semiconductor device or the like with a novel structure in which unnecessary reconfiguration is not performed to reduce power consumption. Another object of one embodiment of the present invention is to provide a highly reliable semiconductor device or the like with a novel structure. Another object of one embodiment of the present invention is to provide a semiconductor device or the like with a novel structure and less power consumption. Another object of one embodiment of the present invention is to provide a semiconductor device or the like with a novel structure in which transistors are highly integrated. Another object of one embodiment of the present invention is to provide a semiconductor device or the like with a novel structure.

Note that the objects of the present invention are not limited to the above. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device including a programmable circuit having a function of changing a circuit structure using a configuration memory in which charge is held when a first transistor is turned off and a potential corresponding to the charge is stored as configuration data; a monitor circuit which monitors a change in the potential corresponding to the charge and outputs a signal in accordance with the potential change; and a controller which controls reset of the configuration data in accordance with the signal.

One embodiment of the present invention provides a semiconductor device or the like with a novel structure in which unnecessary reconfiguration is not performed. Another embodiment of the present invention provides a semiconductor device or the like with a novel structure in which unnecessary reconfiguration is not performed to reduce power consumption. Another embodiment of the present invention provides a highly reliable semiconductor device or the like with a novel structure. Another embodiment of the present invention provides a semiconductor device or the like with a novel structure and less power consumption. Another embodiment of the present invention provides a semiconductor device or the like with a novel structure in which transistors are highly integrated. Another embodiment of the present invention provides a semiconductor device or the like with a novel structure.

Note that the effects of the present invention are not limited to the above. The effects described above do not disturb the existence of other effects. The other effects are the ones that are not described in the above effects and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

In the accompanying drawings:

FIG. 15 is a timing chart showing one embodiment of the present invention;

DETAILED DESCRIPTION OF THE INVENTION

Figure 1:
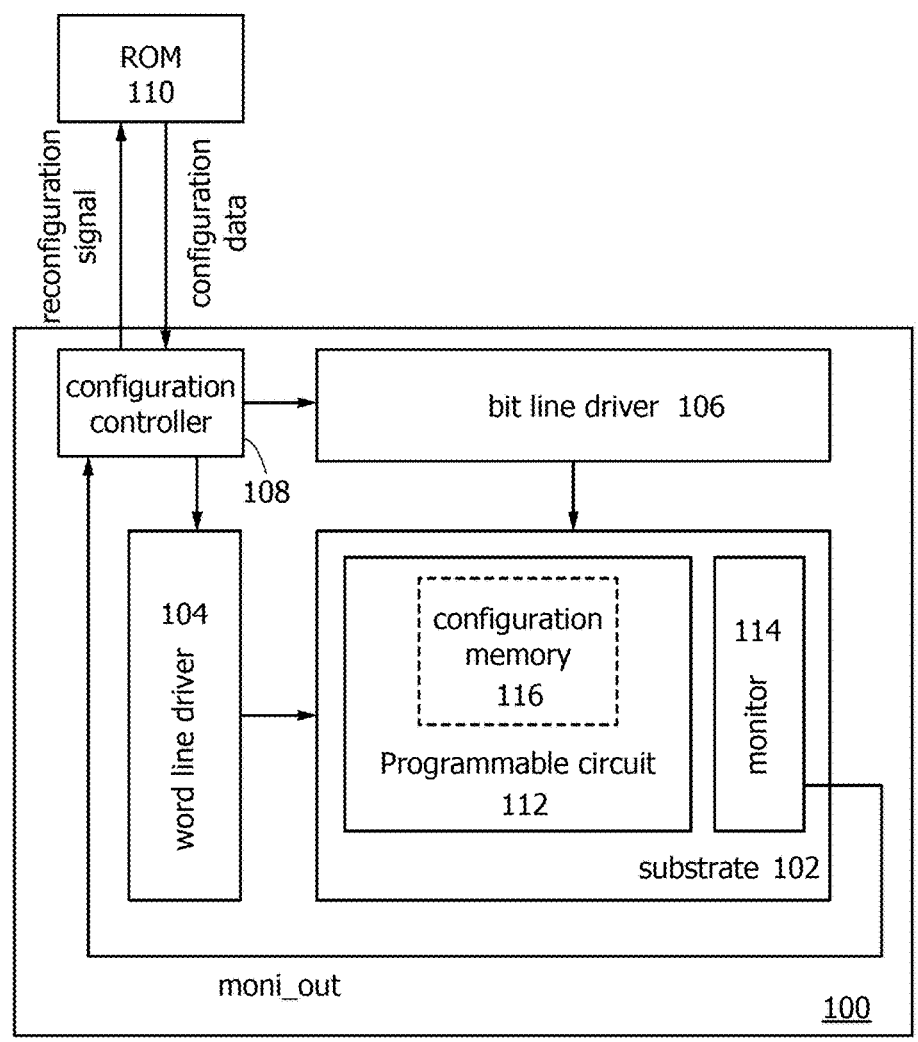
FIG. 1 is a block diagram showing one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the drawings, the size, the layer thickness, or the region is exaggerated for clarity in some cases. Therefore, embodiments of the present invention are not limited to such a scale. Note that drawings are schematic views of ideal examples, and the embodiments of the present invention are not limited to the shape or the value illustrated in the drawings. For example, variation in signal, voltage, or current due to noise or a difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Here, since the source and the drain of the transistor may change depending on a structure, operating conditions, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

Note that in this specification, the expression "A and B are connected" means the case where "A and B are electrically connected" as well as the case where "A and B are directly connected". Here, the expression "A and B are electrically connected" means the case where electric signals can be transmitted and received between A and B when an object having any electric action exists between A and B.

Note that in this specification, terms for describing arrangement, such as "over" and "under", are used for convenience for describing the positional relationship between components with reference to drawings. Furthermore, the positional relationship between components is changed as appropriate in accordance with a direction in which each component is described. Thus, the positional relationship is not limited to that described with a term used in this specification and can be explained with another term as appropriate depending on the situation.

Note that the layout of circuit blocks in a drawing specifies the positional relationship for description. Thus, even when a drawing shows that different functions are achieved in different circuit blocks, an actual circuit or region may be configured so that the different functions are achieved in the same circuit block. Furthermore, the function of each circuit block in a drawing is specified for description. Thus, even when one circuit block is illustrated, an actual circuit or region may be configured so that processing which is illustrated as being performed in the one circuit block is performed in a plurality of circuit blocks.

Note that a voltage refers to a potential difference between a given potential and a reference potential (e.g., a ground potential) in many cases. Therefore, a voltage, a potential, and a potential difference can also be referred to as a potential, a voltage, and a voltage difference, respectively. Note that a voltage refers to a potential difference between two points, and a potential refers to electrostatic energy (electric potential energy) of a unit electric charge at a given point in an electrostatic field.

Note that in general, a potential and voltage are relative values. Therefore, a ground potential is not always 0 V.

In this specification and the like, the term "parallel" indicates that the angle between two straight lines ranges from −10° to 10°, and accordingly also includes the case where the angle ranges from −5° to 5°. In addition, the term "perpendicular" indicates that the angle between two straight lines ranges from 80° to 100°, and accordingly includes the case where the angle ranges from 85° to 95°.

In this specification and the like, the trigonal and rhombohedral crystal systems are included in the hexagonal crystal system.

Embodiment 1

In this embodiment, an example of a structure of a semiconductor device having a function as a PLD will be described.

First, an example of a block diagram of the semiconductor device will be described with reference to FIG. 1.

A semiconductor device 100 shown in FIG. 1 includes a programmable circuit 112 and a monitor circuit 114 which are over a substrate 102. The semiconductor device 100 also includes a controller 108. Moreover, the semiconductor device 100 includes a word line driver circuit 104 and a bit line driver circuit 106. FIG. 1 also shows a memory device 110 (ROM) in addition to the semiconductor device 100. Also in FIG. 1, the programmable circuit 112 includes a configuration memory 116 which stores configuration data. The configuration data indicates a change of a logic function of the programmable circuit 112, a connection state between circuits, or a signal direction at input and output terminals.

The programmable circuit 112 includes a plurality of programmable logic elements (PLEs) and programmable switch elements (PSEs). The PLEs and the PSEs each include the configuration memory 116. The configuration memories 116 included in the PLEs and the PSEs are circuits in each of which a transistor is turned off to hold charge and a potential corresponding to the charge is stored as configuration data. In accordance with the configuration data of the configuration memory 116, the programmable circuit 112 can change a logic function, a connection state between circuits, or a signal direction at the input and output terminals.

Note that the programmable circuit 112 is simply referred to as a circuit in some cases because it is a circuit having a function changed depending on the configuration data stored in the configuration memory 116. In that case, the programmable circuit 112 might be referred to as a first circuit, for example, and have other functions.

In the configuration memory 116 in the programmable circuit 112, charge can be held when a transistor is turned off and a potential corresponding to the charge can be stored as configuration data; hence, a transistor with a low off-state current is used. Note that the configuration memory 116 is simply referred to as a circuit in some cases. In that case, the configuration memory 116 might be referred to as a first circuit, for example, and have other functions. Here, the "low off-state current" means that the normalized off-state current per micrometer of a channel width with a source-drain voltage of 1 V to 2 V at room temperature is less than or equal to 100 zA, preferably less than or equal to 10 zA, and more preferably less than or equal to 1 zA.

The monitor circuit 114 has a function of monitoring a state of configuration memory 116, for example, a change in the potential corresponding to charge that is stored as configuration data in the configuration memory 116, and outputting a monitor signal (moni_out) to the controller 108 in accordance with the potential change. The monitor circuit 114 as well as the configuration memory 116 includes a transistor with a low off-state current. The monitor circuit 114 outputs, as a trigger, a signal change obtained by a change in the potential held by the transistor to the controller 108, so that the reset of configuration data by the controller 108 can be controlled.

Note that the monitor circuit 114 is simply referred to as a circuit in some cases because it is a circuit that has functions of monitoring a change in potential and outputting a monitor signal to the controller 108 in accordance with the potential change. In that case, the monitor circuit 114 might be referred to as a second circuit, for example, and have other functions.

Hereinafter, to avoid confusion between the transistor with a low off-state current in the programmable circuit 112 and the transistor with a low-off state current in the monitor circuit 114, the former is also referred to as a first transistor and the latter is also referred to as a second transistor.

Note that the bit line driver circuit 106 is simply referred to as a circuit in some cases because it is a circuit having a function of driving a bit line. In that case, the bit line driver circuit 106 might be referred to as a first circuit, for example, and have other functions.

Note that the word line driver circuit 104 is simply referred to as a circuit in some cases because it is a circuit having a function of driving a word line. In that case, the word line driver circuit 104 might be referred to as a first circuit, for example, and have other functions.

With such a structure, reconfiguration of the configuration memory can be performed before configuration data is lost. This allows the configuration data to be maintained in the configuration memory 116. As a result, a highly reliable semiconductor device can be provided.

Also with such a structure, reconfiguration can be performed every time data is lost, which does not need periodical reconfiguration. Accordingly, unnecessary reconfiguration can be reduced as compared with the structure where reconfiguration is performed periodically. That is, reconfiguration can be performed only when needed, resulting in lower power consumption.

Note that it is preferable that the first transistor in the programmable circuit 112 and the second transistor in the monitor circuit 114 be manufactured in the same process. In other words, it is preferable that a semiconductor layer of the first transistor in the programmable circuit 112 and a semiconductor layer of the second transistor in the monitor circuit 114 be in the same layer. With such a structure, data loss in the programmable circuit 112 and data loss in the monitor circuit 114 can be caused at almost the same time, so that the reliability of the semiconductor device can be improved.

The amount of change in the potential of the node where charge is held is preferably different between the programmable circuit 112 and the monitor circuit 114. Specifically, the capacitance of a capacitor connected to the second transistor is preferably lower than that of a capacitor connected to the first transistor. Alternatively, the off-state current of the second transistor is preferably higher than that of the first transistor in order to make a difference in the amount of change in the potential of the node where charge is held between the programmable circuit 112 and the monitor circuit 114.

Figure 23:
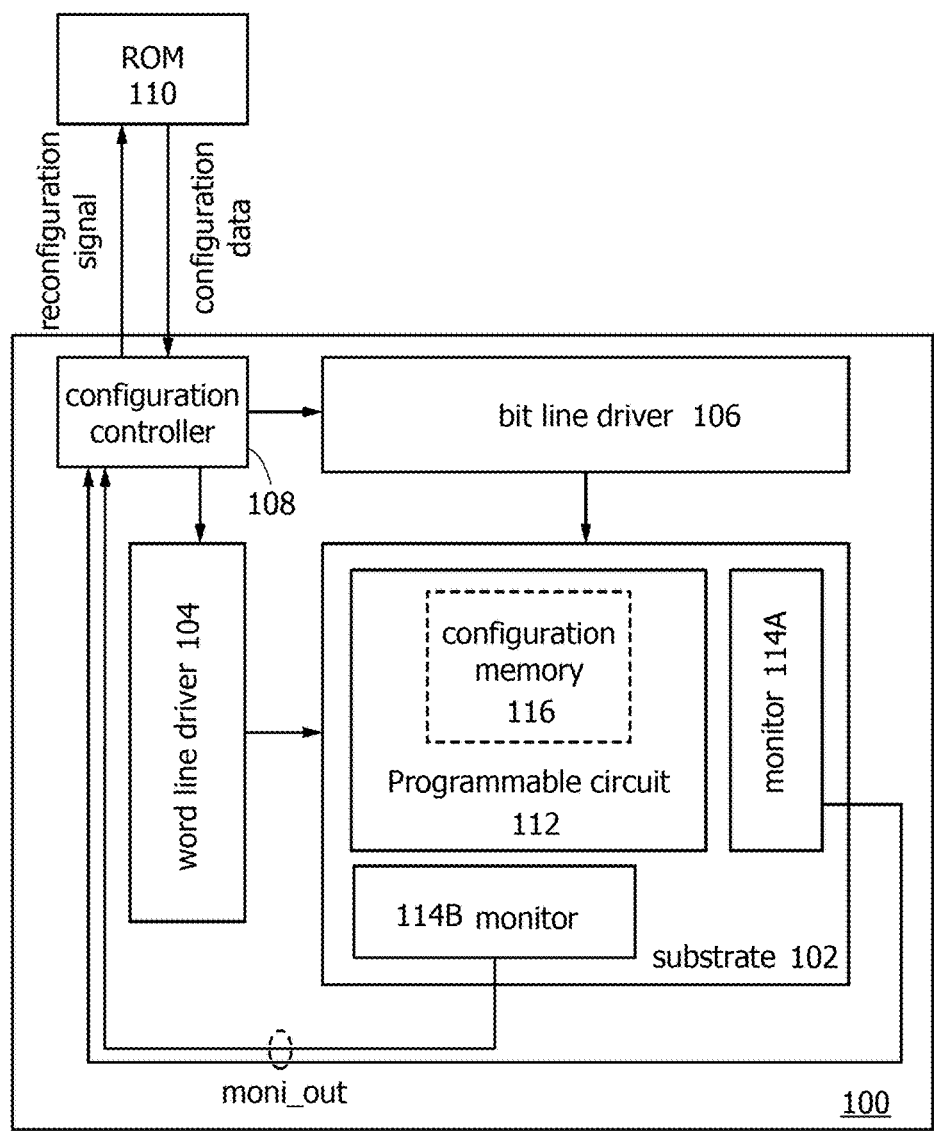
FIG. 23 is a block diagram showing one embodiment of the present invention.

The semiconductor device 100 may have two or more monitor circuits 114. For example, as shown in FIG. 23, the semiconductor device 100 may include a monitor circuit 114A and a monitor circuit 114B. A logical product of monitor signals output from the plurality of monitor circuits may be obtained to be supplied to the controller 108. With such a structure, reconfiguration can be performed on the basis of variation in the time of data loss in the programmable circuit 112, so that the reliability of the semiconductor device can be improved.

With the aforementioned structure in which the amount of change in the potential of the node where charge is held is different between the programmable circuit 112 and the monitor circuit 114, the configuration memory can be reconfigured more reliably before configuration data is lost, resulting in improved reliability of the semiconductor device.

Although FIG. 1 shows an example in which the programmable circuit 112 and the monitor circuit 114 are provided over the substrate 102, other structures may be employed. For example, at least one of the controller 108, the word line driver circuit 104, and the bit line driver circuit 106 may be provided over the substrate 102 in addition to the programmable circuit 112 and the monitor circuit 114. With such a structure, transistors in the circuits can be manufactured at the same time, leading to cost reduction.

The controller 108 generates signals for controlling the word line driver circuit 104 and the bit line driver circuit 106 on the basis of the monitor signal supplied from the monitor circuit 114 and the configuration data supplied from the memory device 110, and outputs the generated signals.

When the monitor signal is supplied from the monitor circuit 114 to the controller 108, the configuration memory is reconfigured (reset). Specifically, the controller 108 outputs a reconfiguration signal to the memory device 110 in which the configuration data is stored, and requests the configuration data. The memory device 110 outputs the configuration data to the controller 108 in accordance with the reconfiguration signal. The controller 108 outputs a signal to the word line driver circuit 104 and the bit line driver circuit 106 so that the obtained configuration data is stored in the configuration memory 116 included in the programmable circuit 112.

For example, a start pulse, a clock signal, configuration data, and the like may be supplied from the controller 108 to the word line driver circuit 104 and the bit line driver circuit 106. In that case, the word line driver circuit 104 and the bit line driver circuit 106 are controlled so that the configuration data is stored in the configuration memory 116 with use of a shift register or the like.

Note that the controller 108 is simply referred to as a circuit in some cases because it is a circuit that generates signals for controlling the word line driver circuit 104 and the bit line driver circuit 106 on the basis of the monitor signal supplied from the monitor circuit 114 and the configuration data supplied from the memory device 110, and outputs the generated signals. In that case, the controller 108 might be referred to, for example, as a third circuit.

In the semiconductor device 100 described above, the first transistor is turned off to hold charge, a potential corresponding to the charge is stored as configuration data in the configuration memory 116 included in the programmable circuit 112, and a change in the potential of the configuration memory 116 is monitored using the second transistor included in the monitor circuit 114. The leakage of charge held by the second transistor is similar to that of charge held by the first transistor. A potential change corresponding to the charge held by the second transistor is reflected by a potential change corresponding to the charge held by the first transistor. The monitor circuit 114 monitors the potential change corresponding to the charge held by the second transistor to obtain information on the potential change corresponding to the charge held by the first transistor. In the semiconductor device 100, a monitor signal is generated in the monitor circuit 114 with the potential change in the monitor circuit 114 used as a trigger, and the configuration memory can be reconfigured by the controller 108 using the monitor signal. With such a structure, the configuration memory 116 can be reconfigured before the configuration data is lost in the programmable circuit 112, resulting in improved reliability of the semiconductor device. Also with such a structure, reconfiguration can be performed every time data is lost. Accordingly, power consumption can be reduced as compared with the structure where reconfiguration is performed periodically.

Figure 2:
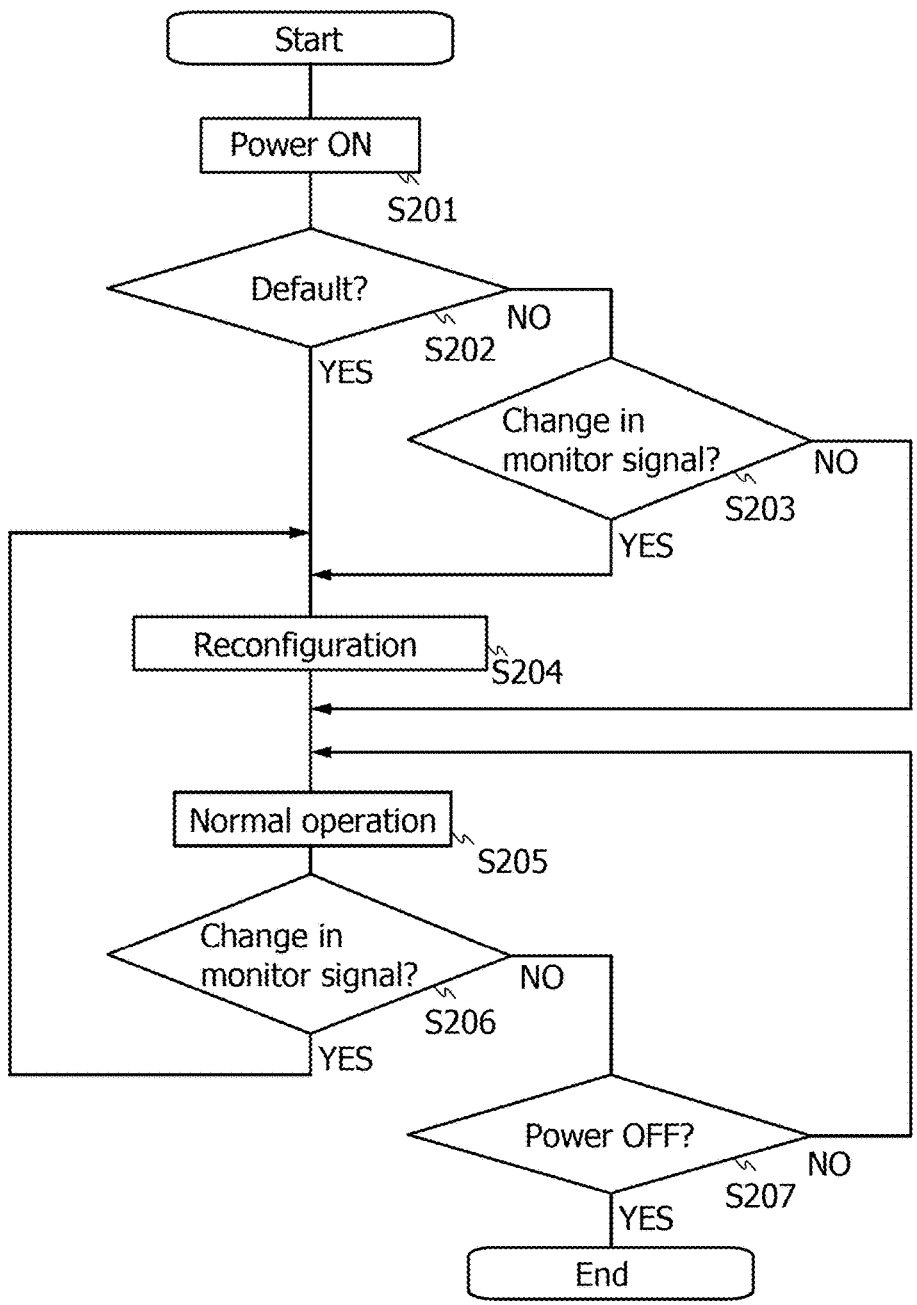
FIG. 2 is a flowchart showing one embodiment of the present invention.

Next, an example of the operation of the semiconductor device 100 shown in FIG. 1 will be described with reference to a flowchart of FIG. 2. The flowchart of FIG. 2 shows the operation, for example, from power on to power off.

First, power is turned on (step S201).

Then, it is determined whether the setting is default or not (step S202). Here, the default refers to the setting in which no configuration data is stored in the configuration memory 116, for example, factory default, or the setting right after a user initializes the configuration memory 116.

In the case where the setting is not default, it is determined whether the potential of the monitor signal output from the monitor circuit 114 has changed (step S203).

In the case where the setting is determined to be default in step S202 or in the case where the potential of the monitor signal is determined to have changed in step S203, the controller 108 requests configuration data in the memory device 110 and performs reconfiguration (step S204).

Then, the configuration data is stored in the configuration memory 116, so that the semiconductor device 100 operates normally (step S205). Also in the case where the potential of the monitor signal output from the monitor circuit 114 is determined not to have changed in step S203, configuration data is considered to exist in the configuration memory 116; thus, the semiconductor device 100 operates normally. Here, the normal operation refers to a state in which configuration data is stored in the configuration memory 116, a logic function, a connection state between circuits, and a signal direction at input and output terminals are determined in the programmable circuit 112, and a function desired by a user is executed.

In the normal operation, charge is held by utilizing the low off-state current of the first transistor and a potential corresponding to the charge is stored as configuration data in the configuration memory 116. In that case, the charge might vary with time to change the configuration data. Hence, the second transistor with a low off-state current is provided in the monitor circuit 114 as in the configuration memory 116. A change in the potential of a node connected to the second transistor continues to be monitored as a change in the potential corresponding to the configuration data. Then, it is determined whether the potential of the monitor signal output from the monitor circuit 114 has changed (step S206).

In the case where the monitor signal output from the monitor circuit 114 has changed, the process returns to step S204, the controller 108 requests configuration data in the memory device 110, so that reconfiguration is performed.

In the case where the potential of the monitor signal output from the monitor circuit 114 has not changed in step S206 in the normal operation, it is determined whether power is turned off or not (step S207). When power is turned off, the process is completed. When power is not turned off, the normal operation is repeated.

In the semiconductor device 100 described above, the configuration memory 116 can be reconfigured before the configuration data is lost in the programmable circuit 112, resulting in improved reliability of the semiconductor device. Moreover, reconfiguration can be performed every time data is lost. Accordingly, power consumption can be reduced as compared with the structure where reconfiguration is performed periodically.

This embodiment can be implemented in appropriate combination with any of the other embodiments.

Embodiment 2

Described in this embodiment is an example of a structure of the programmable circuit 112 shown in Embodiment 1.

Figure 3:
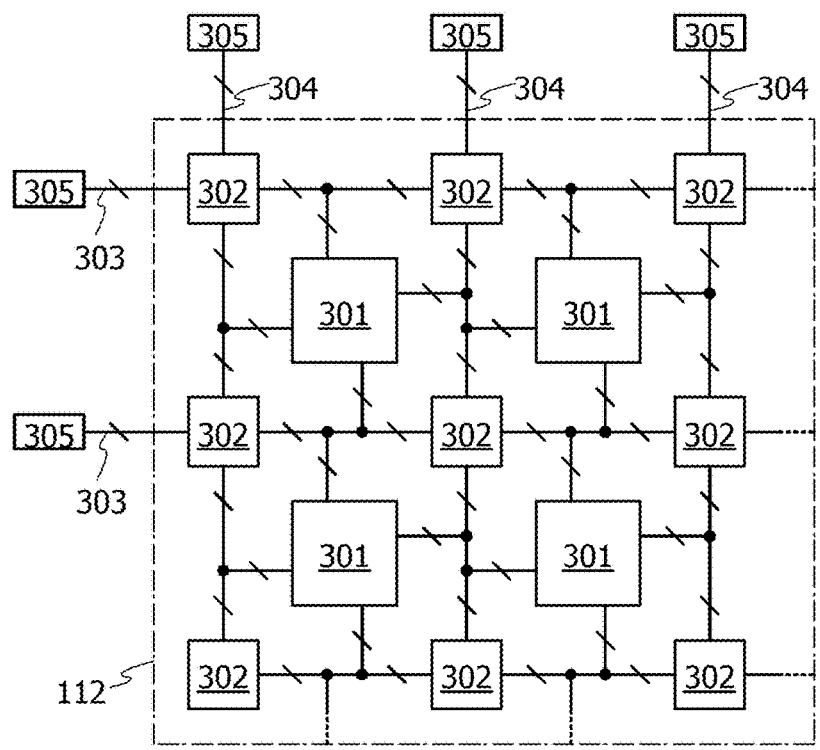
FIG. 3 is a block diagram showing one embodiment of the present invention.

FIG. 3 is an example of a block diagram of the programmable circuit 112 shown in FIG. 1.

The programmable circuit 112 includes a plurality of PLEs 301 arranged in an array. Here, the expression "arranged in an array" means that the PLEs are arranged in a matrix at regular intervals, and the arrangement is not limited to that illustrated in FIG. 3.

A plurality of wirings are formed to surround the PLEs 301. In FIG. 3, these wirings consist of a plurality of horizontal wiring groups 303 and a plurality of vertical wiring groups 304. A wiring group is a bundle of a plurality of wirings. A PSE 302 is provided at an intersection of the horizontal wiring group 303 and the vertical wiring group 304. The horizontal wiring groups 303 and the vertical wiring groups 304 are connected to input and output terminals 305 to transmit and receive signals to and from a circuit provided outside the programmable circuit 112.

The input and output terminals 305 are connected to the horizontal wiring groups 303 and the vertical wiring groups 304 provided around. For example, in FIG. 3, the input and output terminals 305 are connected to the horizontal wiring groups 303 and the vertical wiring groups 304 on the left, right, top, and bottom sides. With the use of the horizontal wiring groups 303 and the vertical wiring groups 304, each of the PLEs 301 can be connected to another PLE 301. A connection path between one PLE 301 and another PLE 301 is determined by a switch provided in the PSE 302.

Whether the switch for changing the connection between wirings in the PSE 302 is turned on or off is determined in accordance with the configuration memory 116 which stores configuration data. In the case of a rewritable structure, the configuration memory provided in the PSE 302 preferably includes a nonvolatile memory element to prevent loss of the stored configuration data due to a stop of supply of power supply voltage.

Figure 4A:
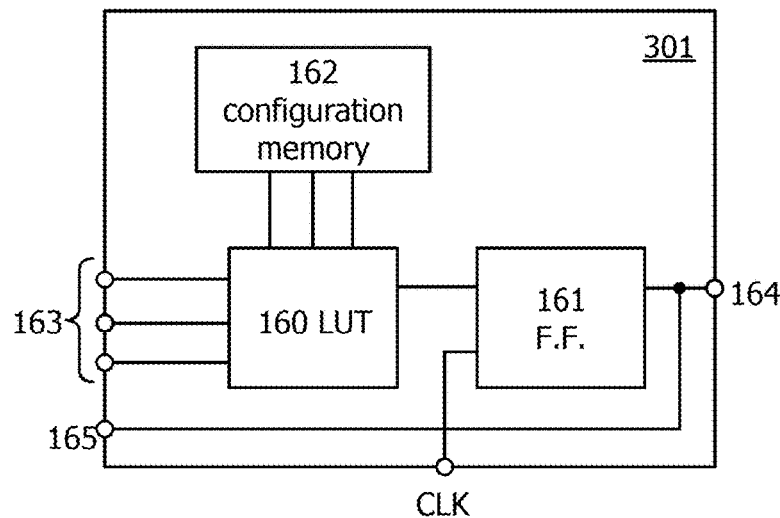
FIGS. 4A and 4B are block diagrams each showing one embodiment of the present invention.
Figure 4B:
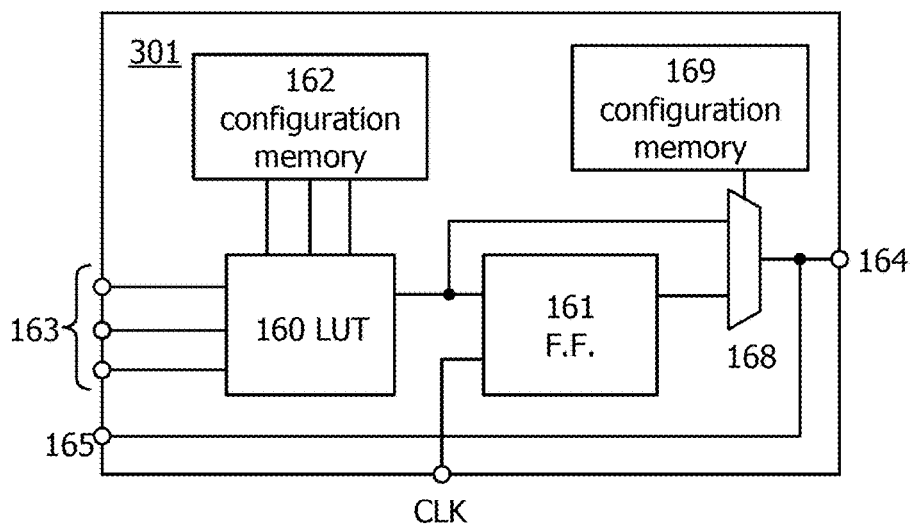

FIGS. 4A and 4B are block diagrams of the PLE 301 in FIG. 3. The PLE 301 in FIG. 4A includes, for example, a lookup table (LUT) 160, a flip-flop (F. F.) 161, and a configuration memory 162. In FIG. 4B, a multiplexer 168 and a configuration memory 169 are provided in addition to the components in FIG. 4A.

The logic function of the LUT 160 can be changed depending on the content of configuration data stored in the configuration memory 162. When the configuration data is determined, one output value of the LUT 160 can be determined with respect to input values of a plurality of input signals supplied to input terminals 163. Then, the LUT 160 outputs a signal containing the output value.

The flip-flop 161 holds the signal output from the LUT 160 and outputs a signal corresponding to the signal in accordance with a clock signal CLK. In FIG. 4A, the signal is output from the flip-flop 161 to a first output terminal 164 and a second output terminal 165.

A signal output from the LUT 160 and a signal output from the flip-flop 161 are input to the multiplexer 168. The multiplexer 168 selects and outputs one of the two output signals in accordance with configuration data stored in the configuration memory 169. The signal is output from the multiplexer 168 to the first output terminal 164 and the second output terminal 165.

The LUT 160 can be formed using a plurality of multiplexers. Configuration data can be input to any of input terminals and control terminals of the plurality of multiplexers.

Figure 5A:
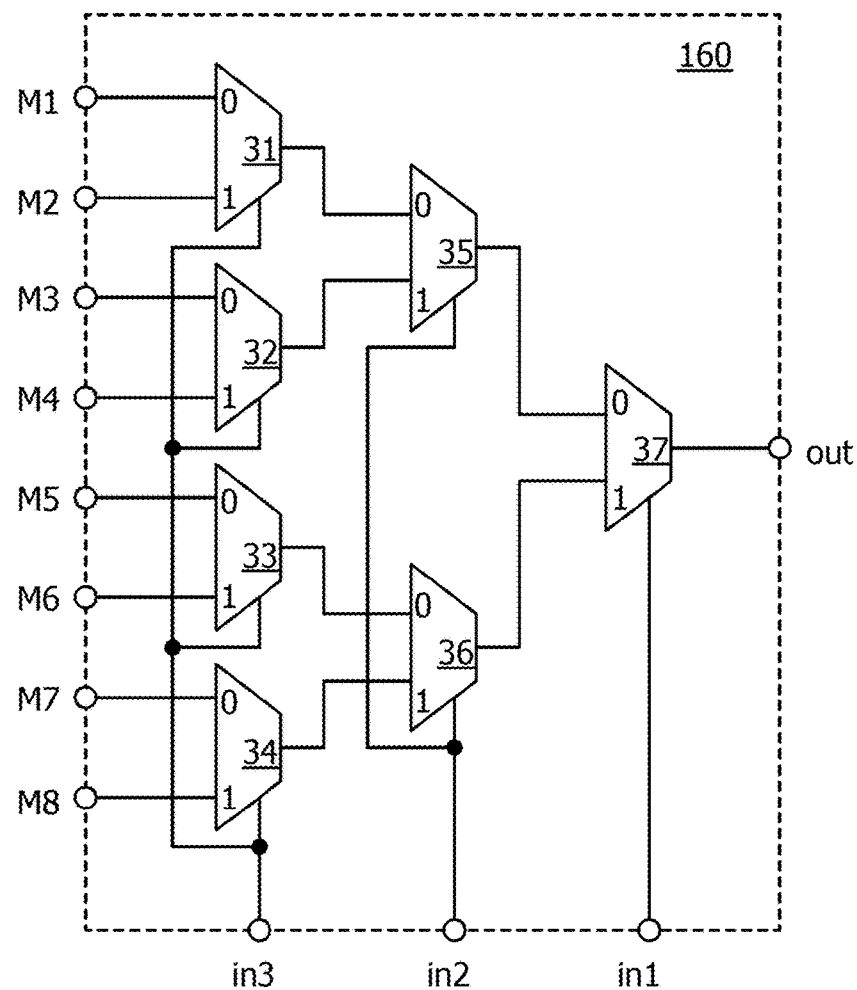
FIGS. 5A and 5B are circuit diagrams each showing one embodiment of the present invention.
Figure 5B:
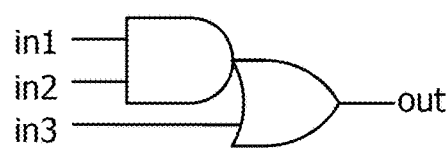

FIGS. 5A and 5B show an example of the structure of the LUT 160.

In FIG. 5A, the LUT 160 includes seven two-input multiplexers (multiplexers 31 to 37). A signal corresponding to configuration data stored in the configuration memory 162 is input to each input terminal of the multiplexers 31 to 34. In FIG. 5A, the input terminals are denoted by M1 to M8. Also in FIG. 5A, input terminals in1 to in3 correspond to the input terminal 163 in FIGS. 4A and 4B.

Control terminals of the multiplexers 31 to 34 are connected to each other and correspond to the input terminal in3 of the LUT 160. Output terminals of the multiplexers 31 and 32 are connected to two input terminals of the multiplexer 35. Output terminals of the multiplexers 33 and 34 are connected to two input terminals of the multiplexer 36. Control terminals of the multiplexers 35 and 36 are connected to each other and correspond to the input terminal in2 of the LUT 160. Output terminals of the multiplexers 35 and 36 are connected to two input terminals of the multiplexer 37. A control terminal of the multiplexer 37 corresponds to the input terminal in1 of the LUT 160. An output terminal of the multiplexer 37 corresponds to an output terminal out of the LUT 160.

Signals corresponding to configuration data stored in the configuration memory 162 are input from the configuration memory 162 to the input terminals M1 to M8, whereby the kind of logic operation performed by the LUT 160 can be determined.

For example, signals corresponding to configuration data stored in the configuration memory and having digital values "0", "1", "0", "1", "0", "1", "1", and "1" are input from the configuration memory to the input terminals M1 to M8 of the LUT 160 in FIG. 5A; in that case, the function of an equivalent circuit shown in FIG. 5B is achieved.

The LUT 160 may further include any or all of a diode, a resistor, a logic element, and a switch in addition to the multiplexers. Examples of the logic element include a buffer, an inverter, a NAND circuit, a NOR circuit, a three-state buffer, and a clocked inverter. Examples of the switch include an analog switch and a transistor.

In the above description, three-input one-output logic operation is performed as shown in FIG. 5B with use of the LUT 160 in FIG. 5A; however, one embodiment of the present invention is not limited to this case. Logic operation with four or more inputs and two or more outputs can be performed by changing the structure of the LUT 160 and configuration data to be input, as appropriate.

Figure 6A:
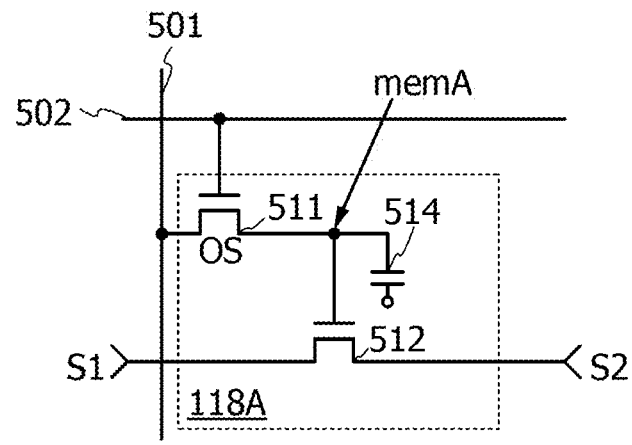
FIGS. 6A and 6B are circuit diagrams each showing one embodiment of the present invention.

FIG. 6A shows an example of the configuration memory that is provided in the PSE 302 and in which charge is held by utilizing a low off-state current of a transistor and a potential corresponding to the charge is stored as configuration data.

A configuration memory 118A provided in the PSE 302, which is shown in FIG. 6A, includes an OS transistor as a first transistor. When the configuration memory has a structure in which charge is held by utilizing the low off-state current of the OS transistor and a potential corresponding to the charge is stored as configuration data, the OS transistor can be stacked over a Si transistor in sequential steps to fabricate the configuration memory, which offers a significant cost advantage.

In the configuration memory 118A in FIG. 6A, charge is held in a node memA and a potential corresponding to the charge is stored as configuration data. The connection between a terminal S1 and a terminal S2 is controlled in accordance with the stored configuration data.

The configuration memory 118A in FIG. 6A includes a transistor 511, a transistor 512, and a capacitor 514. In drawings, "OS" is written in order to indicate that the transistor 511 is an OS transistor. Note that the transistor 511 corresponds to the first transistor described in Embodiment 1.

In the configuration memory 118A in FIG. 6A, a gate of the transistor 511 is connected to a word line 502. One of a source and a drain of the transistor 511 is connected to a data line 501. The other of the source and the drain of the transistor 511 is connected to a gate of the transistor 512 and the capacitor 514. One of a source and a drain of the transistor 512 is connected to a terminal S1. The other of the source and the drain of the transistor 512 is connected to a terminal S2.

In the configuration memory 118A in FIG. 6A, a potential corresponding to H level or L level is held in the node memA as configuration data. Configuration data can be stored in the node memA by using a transistor with a low off-state current as the transistor 511. In the configuration memory 118A, whether the transistor 512 is turned on or off is controlled by the potential of the configuration data. At the time of turning on the transistor 512, electrical connection between the terminal S1 and the terminal S2 can be controlled.

Figure 6B:
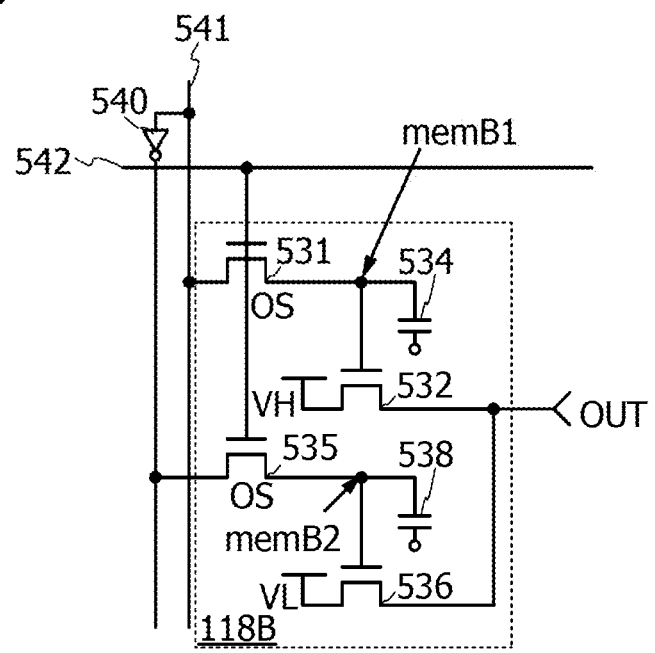

FIG. 6B shows an example of the configuration memory that is provided in the PLE 301 and in which charge is held by utilizing a low off-state current of a transistor and a potential corresponding to the charge is stored as configuration data. Note that the configuration memory provided in the PLE 301 corresponds to the configuration memory 162 or 169 shown in FIGS. 4A and 4B.

A configuration memory 118B provided in the PLE 301, which is shown in FIG. 6B, includes an OS transistor as a first transistor. When the configuration memory has a structure in which charge is held by utilizing the low off-state current of the OS transistor and a potential corresponding to the charge is stored as configuration data, the OS transistor can be stacked over a Si transistor in sequential steps to fabricate the configuration memory, which offers a significant cost advantage.

In the configuration memory 118B in FIG. 6B, charge is held in a node memB1 and a node memB2 and a potential corresponding to the charge is stored as configuration data. An H level or L level potential is output from a terminal OUT in accordance with the stored configuration data.

The configuration memory 118B in FIG. 6B includes a transistor 531, a transistor 535, a transistor 532, a transistor 536, a capacitor 534, and a capacitor 538. In drawings, "OS" is written in order to indicate that the transistors 531 and 535 are OS transistors. Note that the transistors 531 and 535 correspond to the first transistor described in Embodiment 1.

In the configuration memory 118B in FIG. 6B, a gate of the transistor 531 is connected to a word line 542. One of a source and a drain of the transistor 531 is connected to a data line 541. The other of the source and the drain of the transistor 531 is connected to a gate of the transistor 532 and the capacitor 534. One of a source and a drain of the transistor 532 is connected to a wiring VH with an H level potential. The other of the source and the drain of the transistor 532 is connected to an output terminal OUT.

In the configuration memory 118B in FIG. 6B, a gate of the transistor 535 is connected to the word line 542. One of a source and a drain of the transistor 535 is connected to the data line 541 through an inverter 540. The other of the source and the drain of the transistor 535 is connected to a gate of the transistor 536 and the capacitor 538. One of a source and a drain of the transistor 536 is connected to a wiring VL with an L level potential. The other of the source and the drain of the transistor 536 is connected to the output terminal OUT.

In the configuration memory 118B in FIG. 6B, potentials corresponding to H level and L level are held in the node memB1 and the node memB2 as configuration data. Configuration data can be stored in the node memB1 and the node memB2 by using a transistor with a low off-state current as the transistors 531 and 535. In the configuration memory 118B, in accordance with the potential of the configuration data, the transistors 532 and 536 are controlled so that only one of them is turned on. An H level or L level potential can be supplied to the output terminal OUT at the time of turning on one of the transistors 532 and 536.

The aforementioned structure of the programmable circuit 112 included in the semiconductor device 100 can be combined with Embodiment 1. Thus, the configuration memory 116 can be reconfigured before the configuration data is lost in the programmable circuit 112, resulting in improved reliability of the semiconductor device. In addition, reconfiguration can be performed every time data is lost. Accordingly, power consumption can be reduced as compared with the structure where reconfiguration is performed periodically.

This embodiment can be implemented in appropriate combination with any of the other embodiments.

Embodiment 3

In this embodiment, an example of a structure of the monitor circuit 114 shown in Embodiment 1 and operation thereof will be described.

Figure 7:
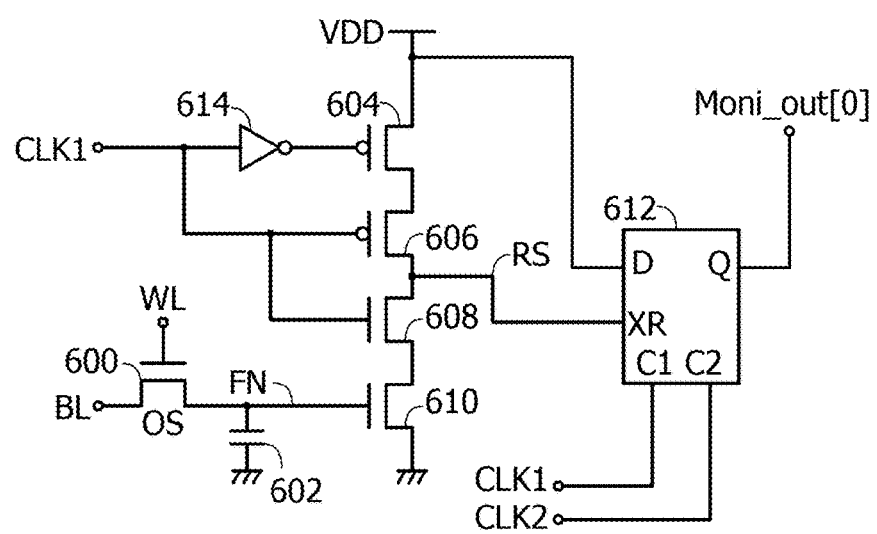
FIG. 7 is a circuit diagram showing one embodiment of the present invention.

FIG. 7 is an example of a block diagram of the monitor circuit 114A, which is an example of the structure of the monitor circuit 114. The monitor circuit 114A includes a second transistor for monitoring a change in the potential corresponding to charge held as configuration data. The second transistor has a function of outputting to the controller 108 a monitor signal obtained by a change in the potential held by a transistor or the like.

The monitor circuit 114A shown in FIG. 7 includes a transistor 600 as the second transistor. The monitor circuit 114A also includes a capacitor 602, a transistor 604, a transistor 606, a transistor 608, a transistor 610, a flip-flop 612, and an inverter 614. In FIG. 7, a node FN represents a node to which the transistor 600, the capacitor 602, and the transistor 610 are connected, and a node RS represents a node to which the transistor 606, the transistor 608, and the flip-flop 612 are connected.

Next, description is made on the connection between elements in the monitor circuit 114A in FIG. 7.

A signal of a word line WL is supplied to a gate of the transistor 600. A signal of a bit line BL is supplied to one of a source and a drain of the transistor 600. The other of the source and the drain of the transistor 600 is connected to one electrode of the capacitor 602 and a gate of the transistor 610. Note that in the following description, an n-channel transistor is used as an example of the transistor 600.

Figure 29A:
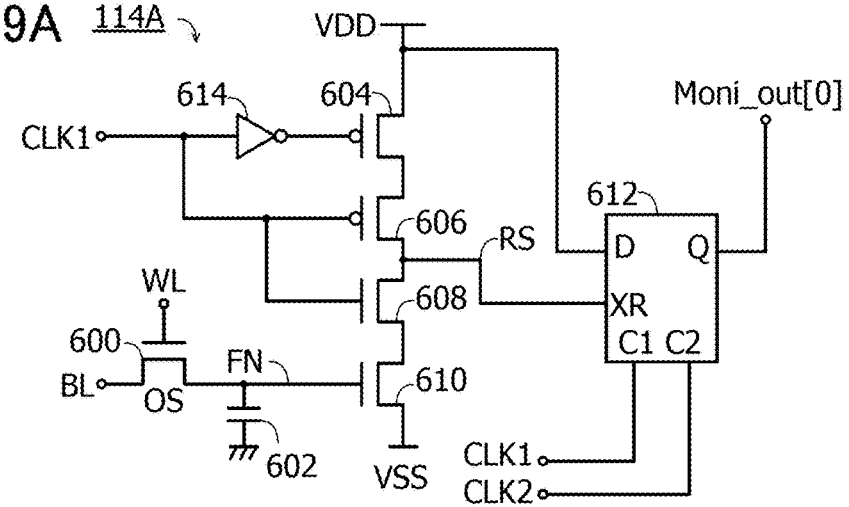
FIGS. 29A to 29C are circuit diagrams each showing one embodiment of the present invention.
Figure 29B:
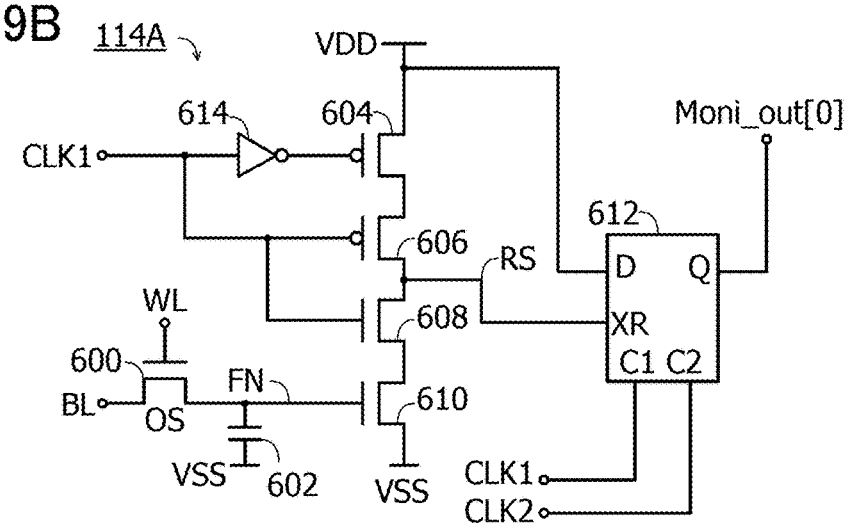
Figure 29C:
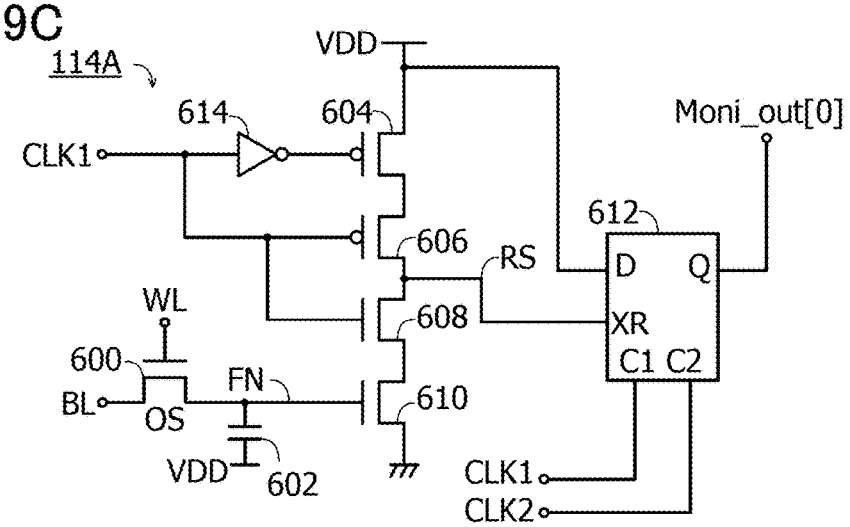

The one electrode of the capacitor 602 is connected to the other of the source and the drain of the transistor 600 and the gate of the transistor 610. The other electrode of the capacitor 602 is grounded. The other electrode of the capacitor 602 only needs to be connected to a fixed potential line, and for example, may be connected to a power source line or the like supplying a high power source potential as shown in FIG. 29C. Note that the capacitor 602 can be omitted by utilizing the parasitic capacitance of the wiring or the transistor.

A first clock signal CLK1 is supplied to a gate of the transistor 604 through the inverter 614. A high power source potential VDD is supplied to one of a source and a drain of the transistor 604. The other of the source and the drain of the transistor 604 is connected to one of a source and a drain of the transistor 606. Note that in the following description, a p-channel transistor is used as an example of the transistor 604.

The first clock signal CLK1 is supplied to a gate of the transistor 606. The one of the source and the drain of the transistor 606 is connected to the other of the source and the drain of the transistor 604. The other of the source and the drain of the transistor 606 is connected to a reset terminal XR of the flip-flop 612 and one of a source and a drain of the transistor 608. Note that in the following description, a p-channel transistor is used as an example of the transistor 606.

The first clock signal CLK1 is supplied to a gate of the transistor 608. The one of the source and the drain of the transistor 608 is connected to the reset terminal XR of the flip-flop 612 and the other of the source and the drain of the transistor 606. The other of the source and the drain of the transistor 608 is connected to one of a source and a drain of the transistor 610. Note that in the following description, an n-channel transistor is used as an example of the transistor 608.

A gate of the transistor 610 is connected to the other of the source and the drain of the transistor 600 and the one electrode of the capacitor 602. The one of the source and the drain of the transistor 610 is connected to the other of the source and the drain of the transistor 608. The other of the source and the drain of the transistor 610 is grounded. The other of the source and the drain of the transistor 610 only needs to be connected to a fixed potential line lower than a high power source potential as shown in FIGS. 29A and 29B. Note that in the following description, an n-channel transistor is used as an example of the transistor 610.

The high power source potential VDD is supplied to a D terminal of the flip-flop 612. The reset terminal XR of the flip-flop 612 is connected to the other of the source and the drain of the transistor 606 and the one of the source and the drain of the transistor 608. The first clock signal CLK1 is supplied to a clock terminal C1 of the flip-flop 612. A second clock signal CLK2 is supplied to a clock terminal C2 of the flip-flop 612. A first monitor signal Moni_out[0] is supplied to an output terminal Q of the flip-flop 612. Note that in the following description, an asynchronous reset D flip-flop is used as an example of the flip-flop 612.

In the monitor circuit 114A shown in FIG. 7, the transistor 600 is preferably an OS transistor, and the other transistors 604, 606, 608, and 610, and transistors included in the flip-flop 612 and the inverter 614 are preferably Si transistors. Such a structure has a significant cost advantage because the OS transistor can be stacked over the Si transistors in sequential steps.

In FIG. 7, "OS" is written in order to indicate that the transistor 600 is an OS transistor. Note that the transistor 600 corresponds to the second transistor described in Embodiment 1.

Figure 30:
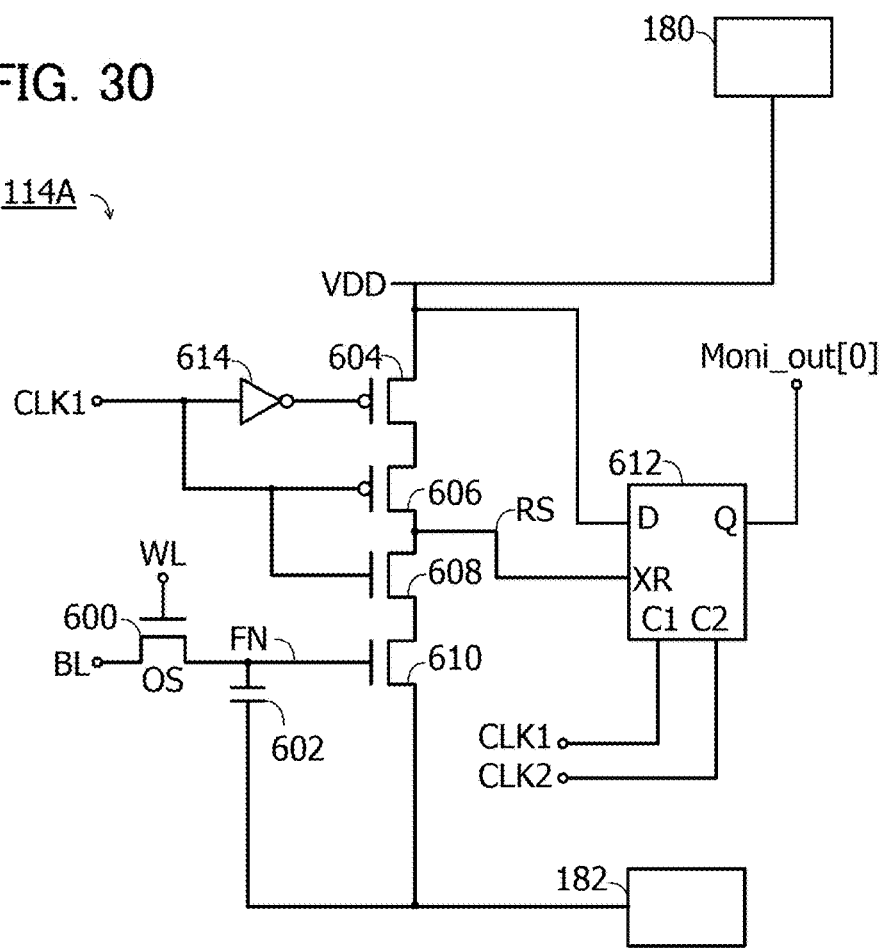
FIG. 30 a circuit diagram showing one embodiment of the present invention.

Here, wirings supplying the fixed potential and the high power source potential VDD are connected to, for example, a power source circuit 180 and a power source circuit 182 as shown in FIG. 30.

That is the description on the connection between elements in the monitor circuit 114A shown in FIG. 7.

The monitor circuit 114A shown in FIG. 7 supplies configuration data to the configuration memory 116 included in the programmable circuit 112. The monitor circuit 114A also supplies an H level potential to the bit line BL and the word line WL, so that the H level potential of the bit line BL is held in the node FN. The potential of the node FN is held by turning off the transistor 600.

Charge is held in the node FN in a manner similar to that in the nodes memA, memB1, and memB2 described in Embodiment 2. Accordingly, a change in the potential of the configuration data can be monitored by monitoring a change in the potential of the node FN.

A potential corresponding to the charge in the node FN is supplied to the gate of the transistor 610. Therefore, the potential of the node FN can be reflected in the conductive state between the source and the drain of the transistor 610.

In the node RS, charging is performed through the transistors 604 and 606 and discharging is performed through the transistors 608 and 610 by the toggling of the first clock signal CLK1. The discharging is controlled by the conductive state between the source and the drain of the transistor 610, i.e., a potential corresponding to the charge in the node FN. Therefore, the conductive state between the source and the drain of the transistor 610 can be reflected in a change in the potential of the node RS.

The change in the potential of the node RS changes the potential of the first monitor signal Moni_out[0] at the output terminal Q of the flip-flop 612. With this potential change used as a trigger, reconfiguration can be performed.

Figure 24:
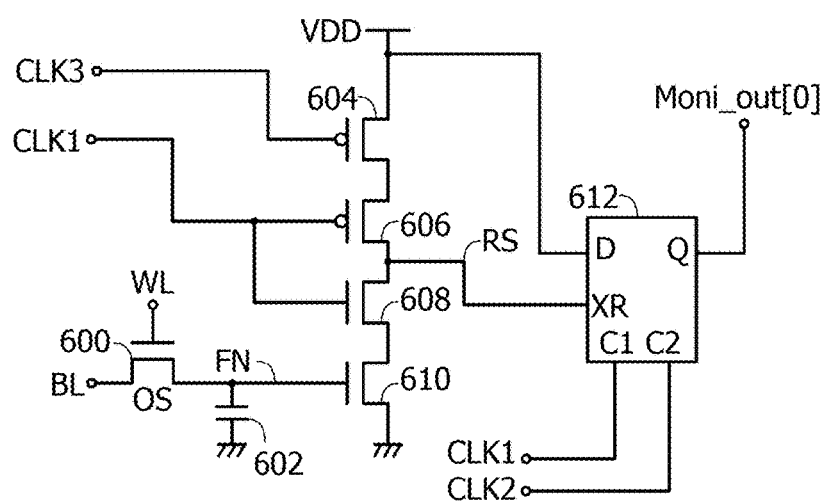
FIG. 24 is a circuit diagram showing one embodiment of the present invention.

Note that one embodiment of the present invention is not limited to the example shown in FIG. 7 in which the inverter 614 is provided. For example, as shown in FIG. 24, a third clock signal CLK3 may be used.

Figure 25A:
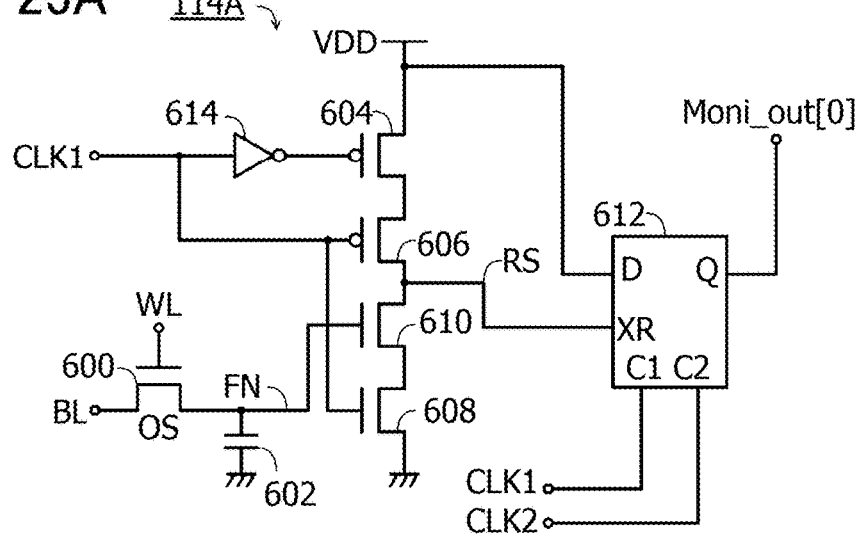
FIGS. 25A to 25C are circuit diagrams each showing one embodiment of the present invention.
Figure 25B:
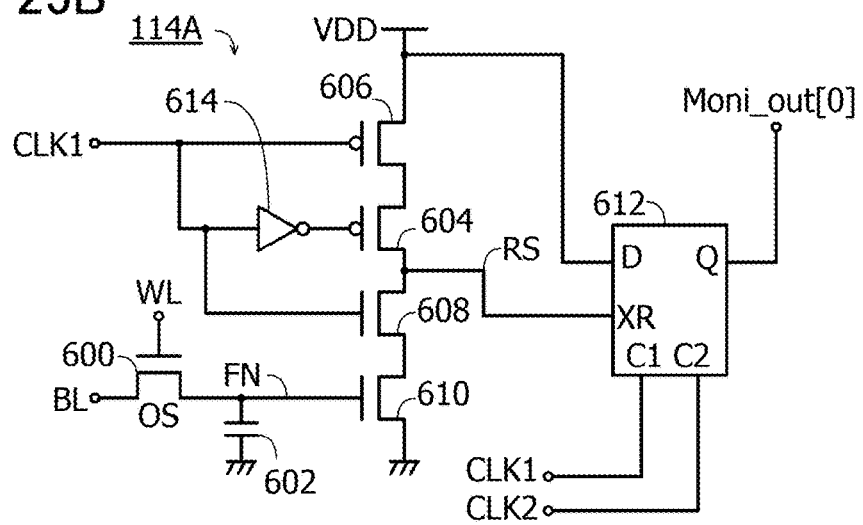
Figure 25C:
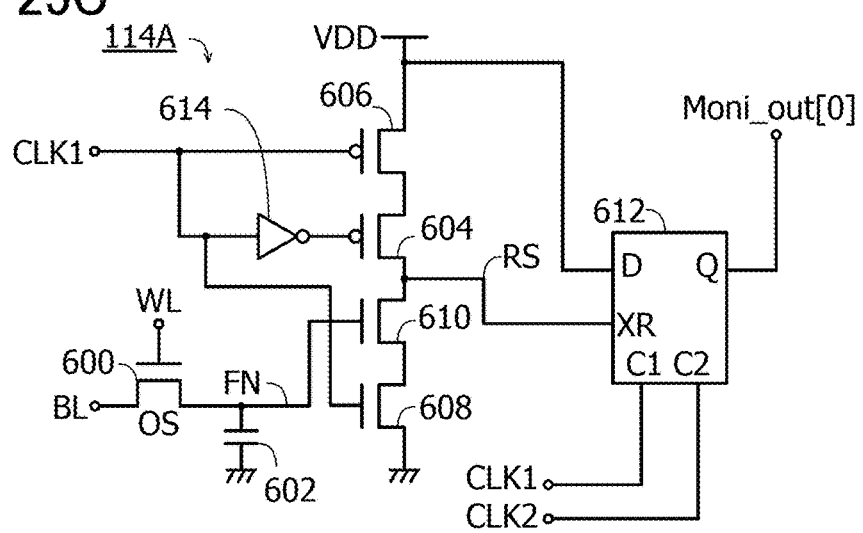
Figure 26A:
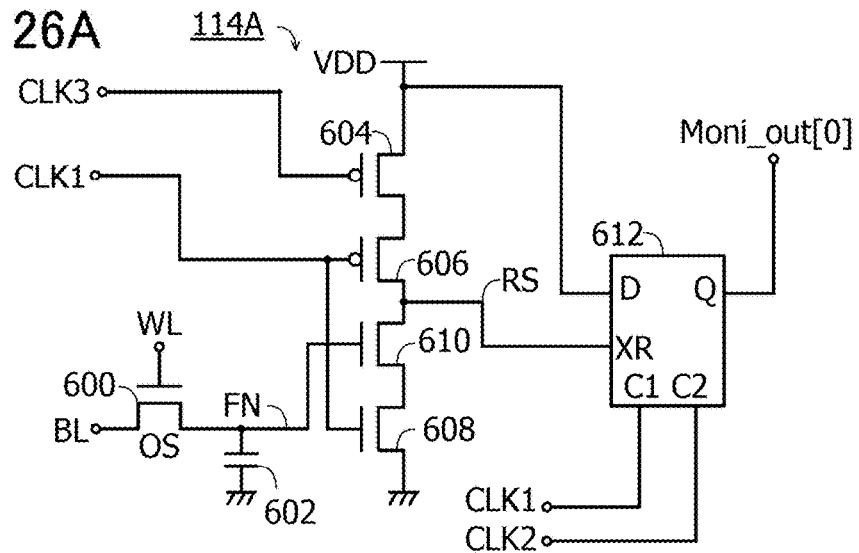
FIGS. 26A to 26C are circuit diagrams each showing one embodiment of the present invention.
Figure 26B:
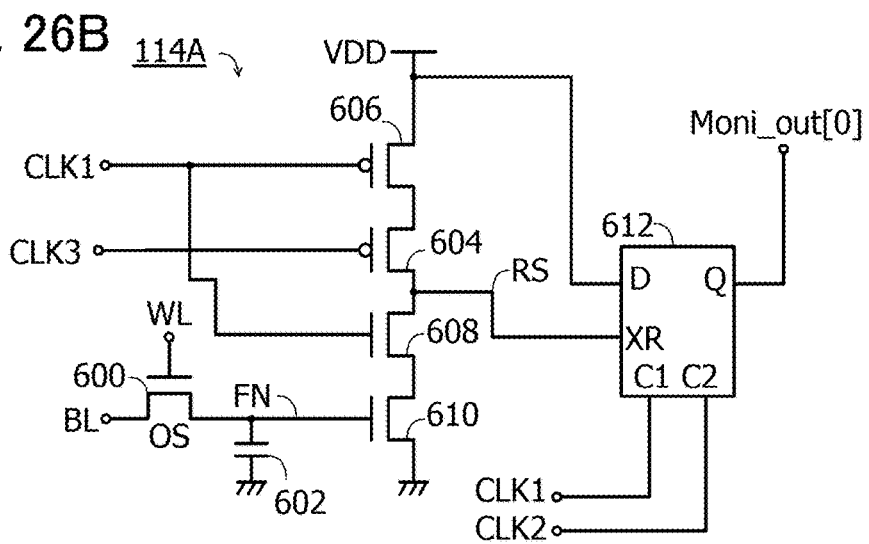
Figure 26C:
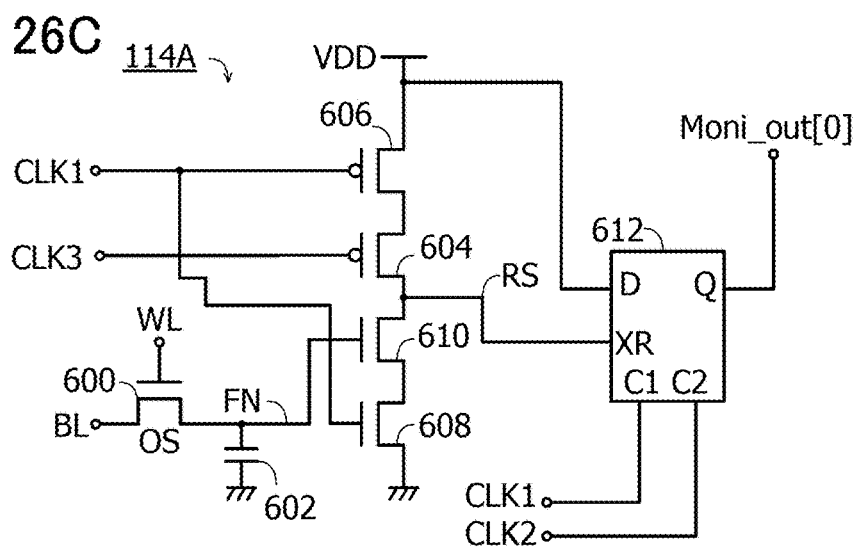

Note that the transistors 604, 606, 608, and 610 can be used in various circuit structures as shown in FIGS. 25A to 25C. Also in that case, the third clock signal CLK3 may be used as shown in FIGS. 26A to 26C.

Figure 8:
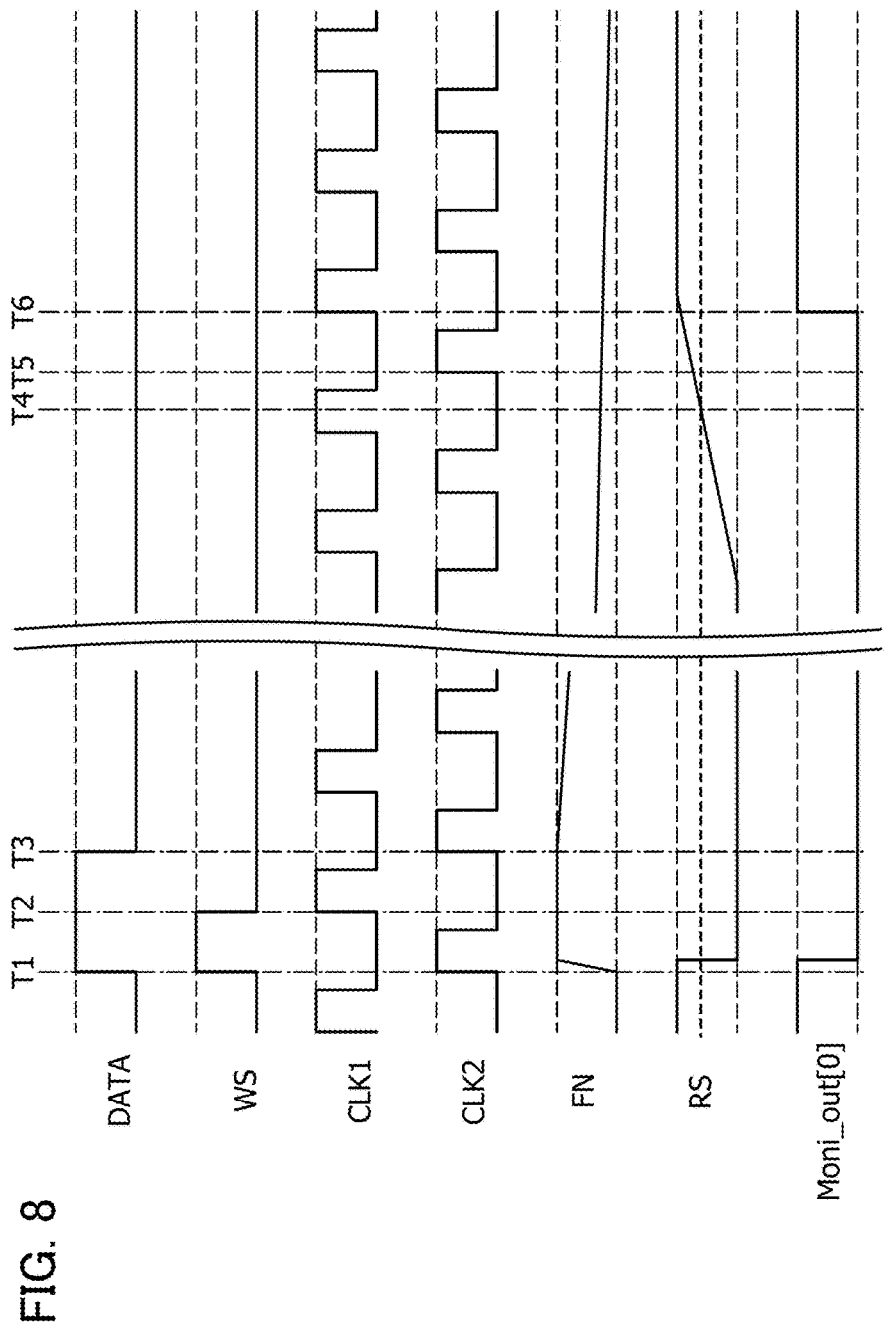
FIG. 8 is a timing chart showing one embodiment of the present invention.

FIG. 8 shows a timing chart of the circuit shown in the diagram of FIG. 7.

In the timing chart of FIG. 8, a signal of the word line WL is denoted as WS and a signal of the bit line BL is denoted as DATA. The timing chart of FIG. 8 also shows a first clock signal CLK1, a second clock signal CLK2, a potential FN of the node FN, a potential RS of the node RS, and the first monitor signal Moni_out[0] in addition to WS and DATA.

In the timing chart of FIG. 8, DATA, WS, and FN are at L level in the initial state. At this time, an L level potential is not supplied to RS. When CLK1 changes from L level to H level (hereinafter referred to as rising) and when CLK1 changes from H level to L level (hereinafter referred to as falling), current flows through the transistors 604 and 606 momentarily, so that RS is at H level. RS is a reset signal of the flip-flop 612. When RS is at H level, the flip-flop 612 is not reset.

First, DATA and WS become H level at time T1. An H level potential is supplied to the gate of the transistor 600, so that current flows between the source and the drain. Then, the H level potential of DATA is supplied to FN, and FN has a potential approximately equal to VDD, i.e., an H level potential. Since the first clock signal CLK1 is at L level, RS and Moni_out[0] maintain H level.

At time T2, WS becomes L level. When the first clock signal CLK1 becomes H level, the transistor 608 is turned on and RS becomes L level. When the RS is at L level, the flip-flop 612 is reset, and Moni_out[0] therefore becomes L level.

At time T3, DATA becomes L level. Current flows through the transistor 610 while FN maintains H level; hence, RS is kept at L level. Since the flip-flop 612 is reset, Moni_out[0] maintains L level.

At time T4, the potential of FN decreases to make the ground potential unable to be supplied to RS. Then, current flows through the transistors 604 and 606 at the rising or falling of CLK1, so that the potential of RS gradually increases. Thus, RS exceeds the logic threshold value of the reset circuit and the flip-flop 612 is not reset.

When CLK2 becomes H level at time T5, H level is loaded into the master latch in the flip-flop 612.

When CLK1 becomes H level at time T6, the H level of the master latch in the flip-flop 612 is loaded into a slave latch, so that Moni_out[0] outputs H level.

With the output of H level from Moni_out[0] used as a trigger, the controller 108 can start reconfiguration. When the reconfiguration starts, the operation returns to time T1 and the timing chart of FIG. 8 is repeated.

An example of the structure of the monitor circuit 114 is described above with reference to FIG. 7 and FIG. 8. However, one embodiment of the present invention is not limited to this example and may employ a structure shown in FIG. 9 and FIG. 10.

Figure 9:
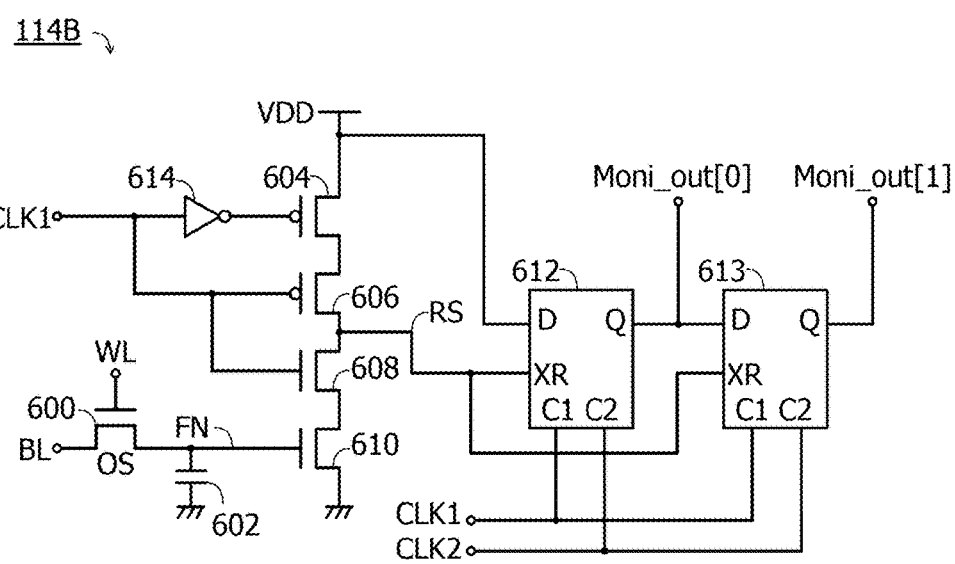
FIG. 9 is a circuit diagram showing one embodiment of the present invention.

FIG. 9 shows an example of a block diagram of the monitor circuit 114B as an example of the structure of the monitor circuit 114. The monitor circuit 114B is different from the monitor circuit 114A in that a flip-flop 613 is provided in addition to the flip-flop 612 to form a shift register.

The shift register in the monitor circuit 114B allows reconfiguration to be avoided even when RS has an H level potential momentarily because of an unexpected error such as noise. Therefore, a semiconductor device including the monitor circuit 114B can operate stably even when the potential of RS changes momentarily because of noise or the like.

The first monitor signal Moni_out[0] is supplied to a D terminal of the flip-flop 613. A reset terminal XR of the flip-flop 613 is connected to the other of the source and the drain of the transistor 606 and the one of the source and the drain of the transistor 608. The first clock signal CLK1 is supplied to a clock terminal C1 of the flip-flop 613. A second clock signal CLK2 is supplied to a clock terminal C2 of the flip-flop 613. A second monitor signal Moni_out[1] is supplied to an output terminal Q of the flip-flop 613. Note that in the following description, an asynchronous reset D flip-flop is used as an example of the flip-flop 613.

Figure 10:
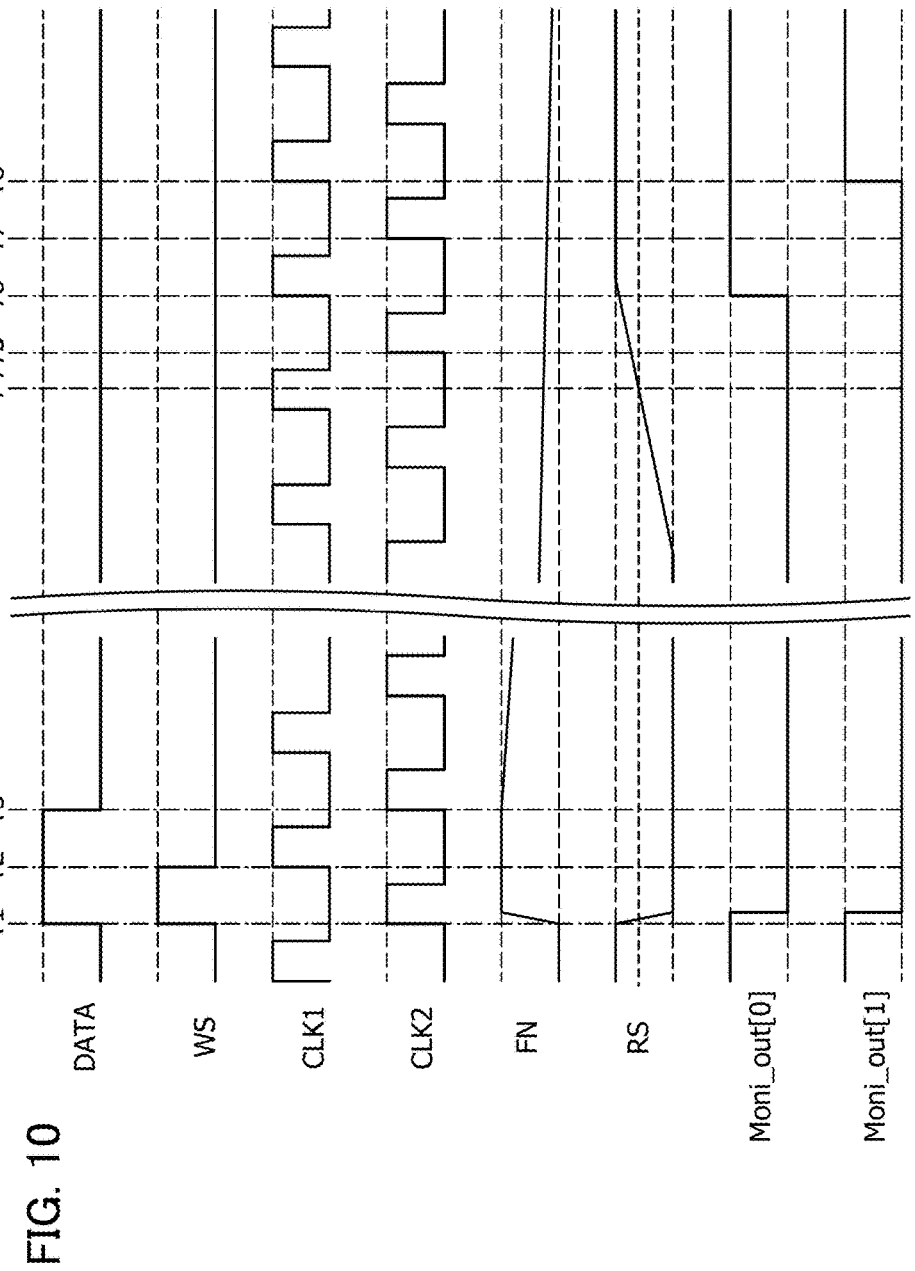
FIG. 10 is a timing chart showing one embodiment of the present invention.

FIG. 10 shows a timing chart of the circuit shown in the diagram of FIG. 9.

The timing chart of FIG. 10 shows the second monitor signal Moni_out[1] in addition to the signals shown in FIG. 8.

The operation of the timing chart of FIG. 10 from time T1 to time T6 is similar to that of FIG. 8; hence, the operation after time T7 will be described.

At time T7, Moni_out[0] at H level is supplied to the D terminal of the flip-flop 613. Accordingly, H level is loaded into the master latch in the flip-flop 613 when CLK2 becomes H level.

When CLK1 becomes H level at time T8, the H level of the master latch in the flip-flop 613 is loaded into a slave latch, so that Moni_out[1] outputs H level.

With the output of H level from Moni_out[1] used as a trigger, the controller 108 can start reconfiguration. When the reconfiguration starts, the operation returns to time T1 and the timing chart of FIG. 10 is repeated.

Examples of the structure of the monitor circuit 114 are described above with reference to FIGS. 7 and 8 and FIGS. 9 and 10. However, one embodiment of the present invention is not limited to these examples and may employ a structure shown in FIGS. 11 to 13.

Figure 11:
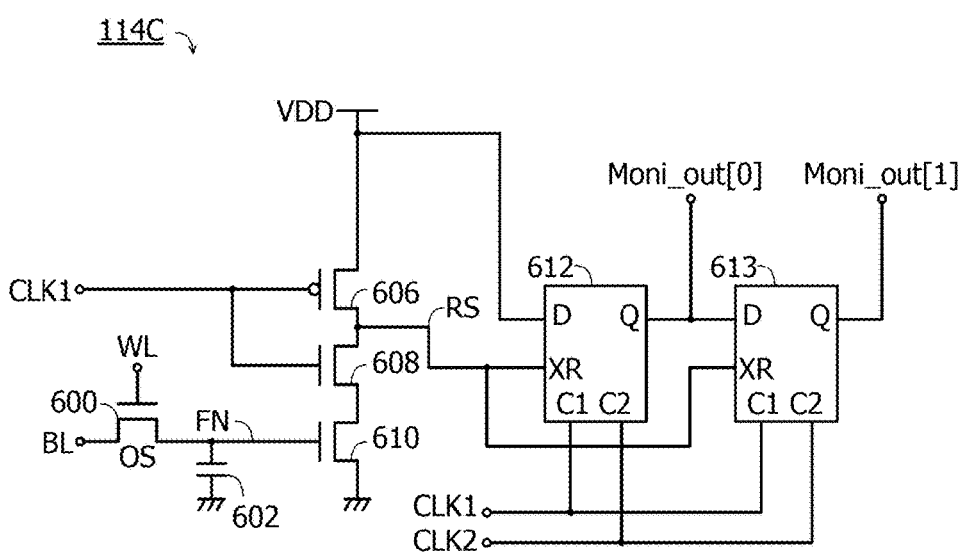
FIG. 11 is a circuit diagram showing one embodiment of the present invention.

FIG. 11 shows an example of a block diagram of a monitor circuit 114C as an example of the structure of the monitor circuit 114. The monitor circuit 114C is different from the monitor circuit 114B in that the transistor 604 and the inverter 614 are omitted.

Figure 27:
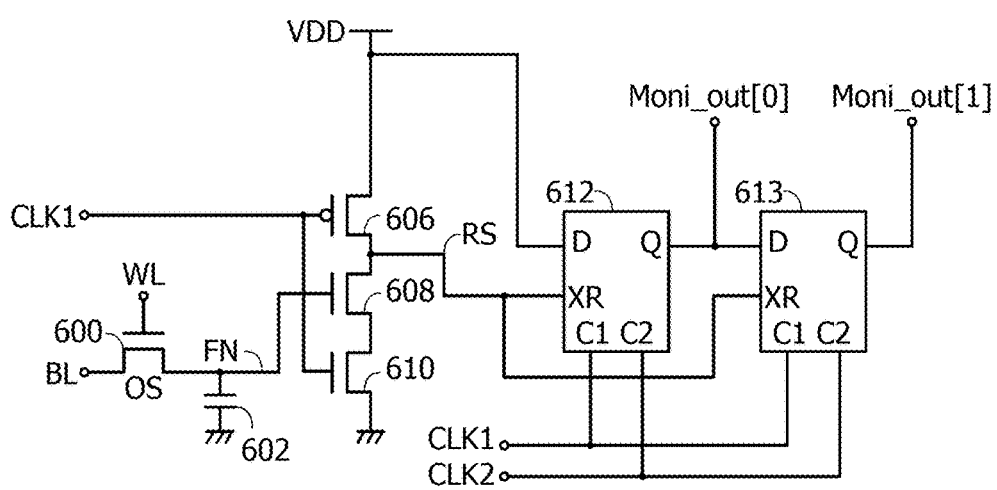
FIG. 27 is a circuit diagram showing one embodiment of the present invention.

Note that the transistors 606, 608, and 610 can be used in various circuit structures as shown in FIG. 27.

Figure 13:
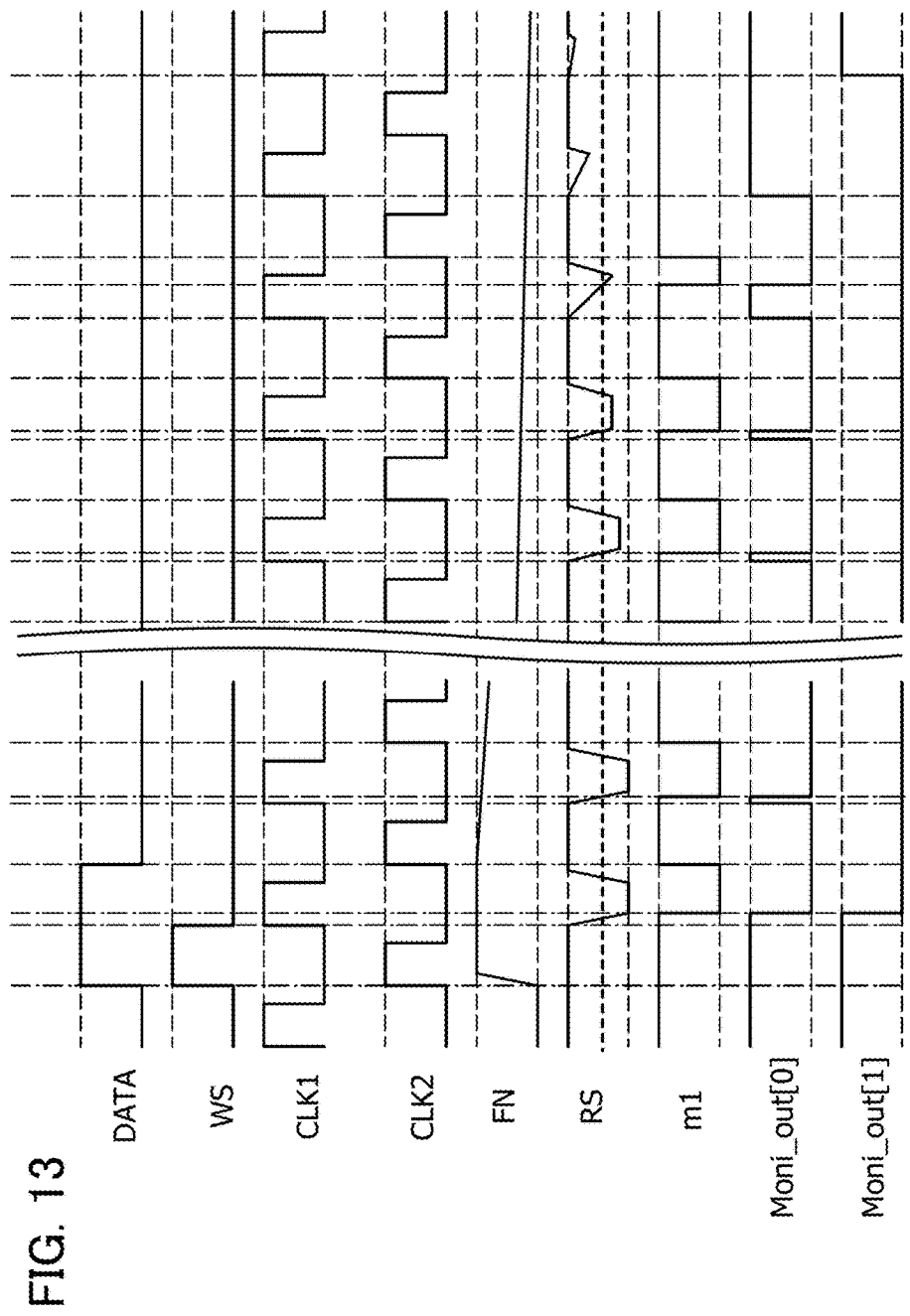
FIG. 13 is a timing chart showing one embodiment of the present invention.

FIG. 13 shows a timing chart of the circuit shown in the diagram of FIG. 11.

Figure 12:
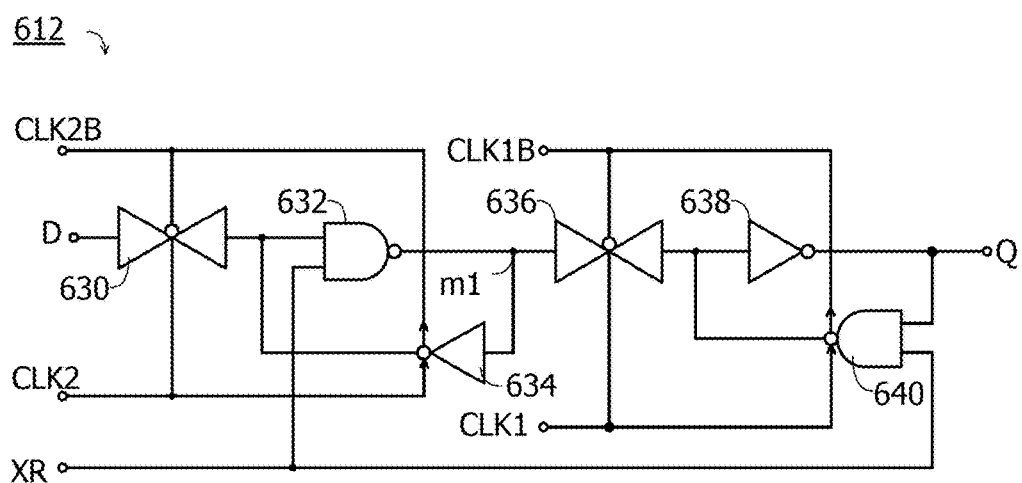
FIG. 12 is a circuit diagram showing one embodiment of the present invention.

Note that for the description of FIG. 13, FIG. 12 shows an example of circuit structures of the flip-flop 612 and the flip-flop 613. FIG. 12 shows an analog switch 630, a NAND 632, a clocked inverter 634, an analog switch 636, an inverter 638, and a clocked NAND 640. A node between a master latch and a slave latch in FIG. 12 is denoted as m1 in FIG. 13. Note that in FIG. 12, CLK1B and CLK2B are inverted signals of CLK1 and CLK2, respectively.

The operation of the timing chart in FIG. 13 is different from that of the timing chart in FIG. 10 in that the amount of charge and discharge in RS increases because of the elimination of the transistor 604, and Moni_out[0] varies with a change in the charge in RS.

Even when Moni_out[0] varies, the controller 108 can start reconfiguration with the output of H level from Moni_out[1] used as a trigger. Therefore, the monitor circuit 114C in FIG. 11 can have a function similar to that in FIG. 10.

Examples of the structure of the monitor circuit 114 are described above with reference to FIGS. 7 and 8, FIGS. 9 and 10, and FIGS. 11 to 13. However, one embodiment of the present invention is not limited to these examples and may employ a structure shown in FIGS. 14 and 15.

Figure 14:
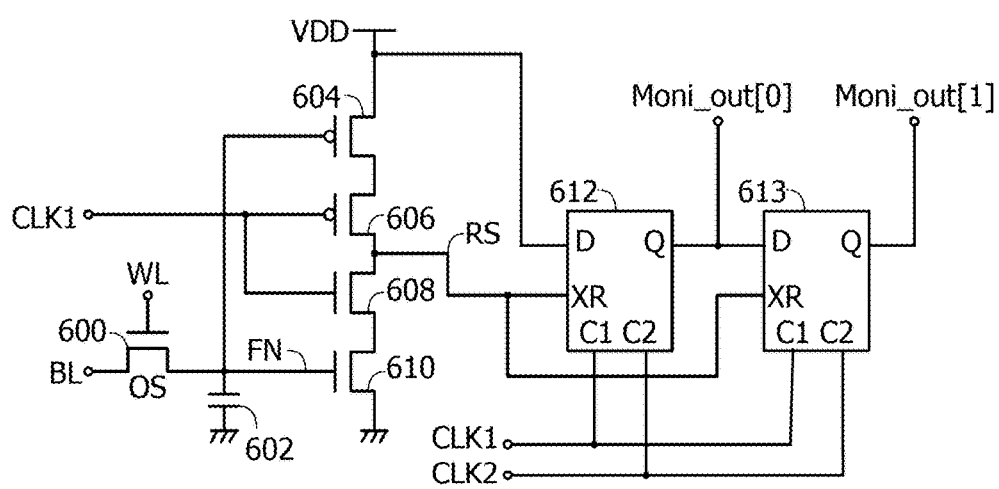
FIG. 14 is a circuit diagram showing one embodiment of the present invention.

FIG. 14 shows an example of a block diagram of a monitor circuit 114D as an example of the structure of the monitor circuit 114. The monitor circuit 114D is different from the monitor circuit 114B in that the inverter 614 is omitted and the gate of the transistor 604 is connected to the node FN.

Figure 28A:
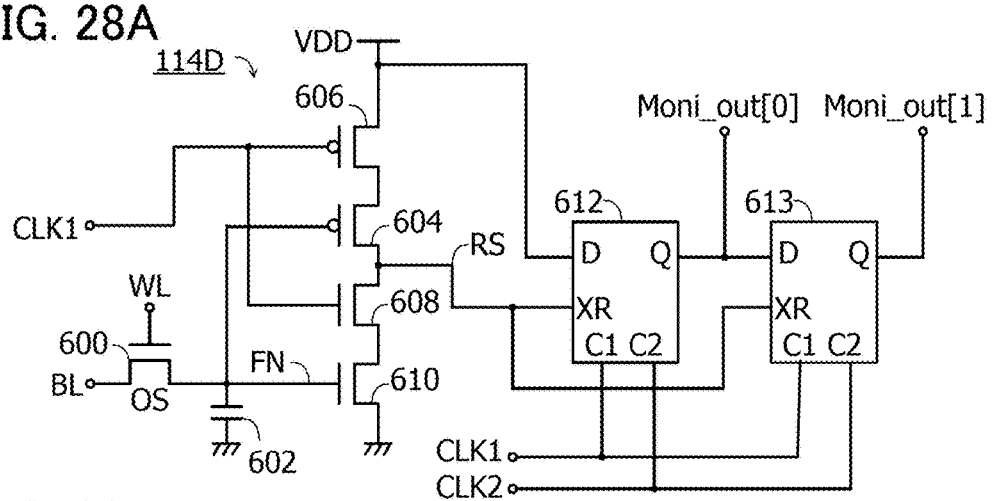
FIGS. 28A to 28C are circuit diagrams each showing one embodiment of the present invention.
Figure 28B:
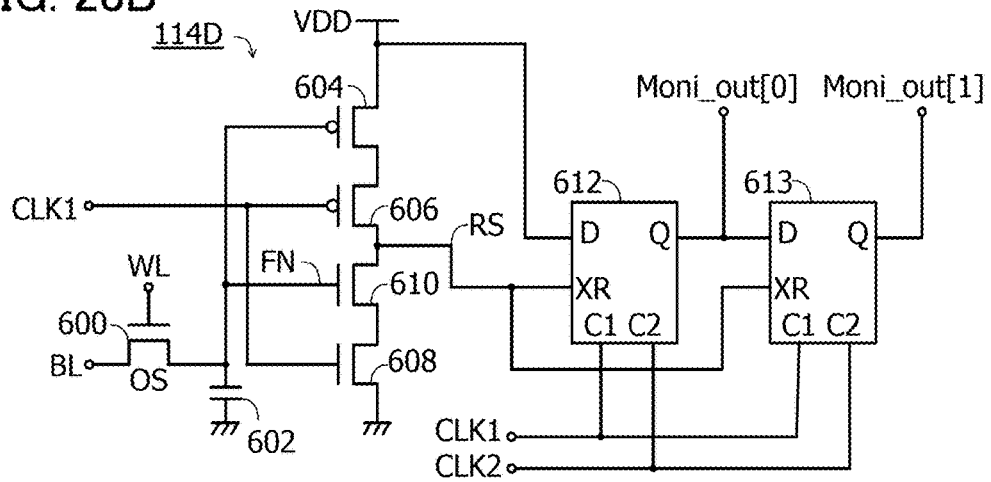
Figure 28C:
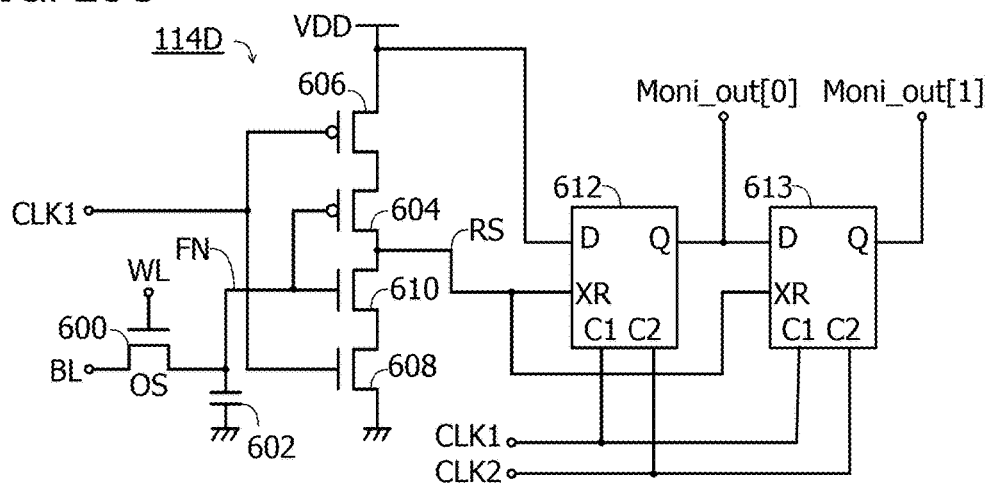

Note that the transistors 604, 606, 608, and 610 can be used in various circuit structures as shown in FIGS. 28A to 28C.

FIG. 15 shows a timing chart of the circuit shown in the diagram of FIG. 14.

The operation of the timing chart in FIG. 15 is different from that of the timing chart in FIG. 10 because of the elimination of the inverter 614.

Even when Moni_out[0] varies, the controller 108 can start reconfiguration with the output of H level from Moni_out[1] used as a trigger. Therefore, the monitor circuit 114D in FIG. 14 can have a function similar to that in FIG. 10.

The aforementioned structures of the monitor circuits 114A to 114D included in the semiconductor device 100 can be combined with Embodiment 1. Thus, the configuration memory 116 can be reconfigured before the configuration data is lost in the programmable circuit 112, resulting in improved reliability of the semiconductor device. In addition, reconfiguration can be performed every time data is lost. Accordingly, power consumption can be reduced as compared with the structure where reconfiguration is performed periodically.

This embodiment can be implemented in appropriate combination with any of the other embodiments.

Embodiment 4

Described in this embodiment is an oxide semiconductor layer that can be used as a semiconductor layer of the transistor with a low off-state current shown in the above embodiments.

An oxide semiconductor used for a channel formation region in the semiconductor layer of the transistor preferably contains at least indium (In) or zinc (Zn). In particular, the oxide semiconductor preferably contains both In and Zn. The oxide semiconductor preferably contains a stabilizer for strongly bonding oxygen, in addition to In and Zn. The oxide semiconductor preferably contains at least one of gallium (Ga), tin (Sn), zirconium (Zr), hafnium (Hf), and aluminum (Al) as the stabilizer.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide with an atomic ratio of In:Ga:Zn=1:1:1, 3:1:2, or 2:1:3 or an oxide with an atomic ratio close to the above atomic ratios can be used.

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For that reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density which is $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower particularly preferably lower than $8\times10^{11}/cm^3$, still further preferably lower than $1\times10^{11}/cm^3$, yet further preferably lower than $1\times10^{10}/cm^3$, and is $1\times10^{-9}/cm^3$ or higher.

The transistor including an i-type or substantially i-type oxide semiconductor film can have extremely favorable off-state current characteristics. For example, the off-state drain current of the transistor including the oxide semiconductor film can be $1\times10^{-18}$ A or less, preferably $1\times10^{-21}$ A or less, and more preferably $1\times10^{-24}$ A or less at room temperature (approximately 25° C.), or $1\times10^{-15}$ A or less, preferably $1\times10^{-18}$ A or less, and more preferably $1\times10^{-21}$ A or less at 85° C. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

The oxide semiconductor film may include one or more of the following: an oxide semiconductor having a single crystal structure (hereinafter referred to as a single crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Furthermore, the oxide semiconductor film may be formed using a CAAC-OS film. Furthermore, the oxide semiconductor film may include an amorphous oxide semiconductor and an oxide semiconductor having a crystal grain. Described below are the CAAC-OS and the microcrystalline oxide semiconductor as typical examples.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each layer of metal atoms has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

Figure 16A:
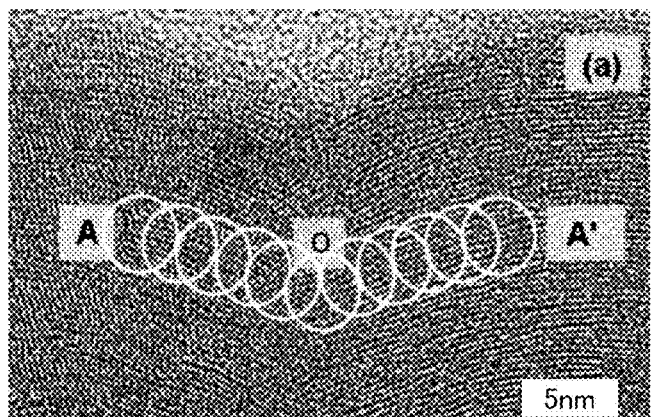
FIGS. 16A and 16B are cross-sectional TEM images and FIG. 16C is a local Fourier transform image of an oxide semiconductor.
Figure 16B:
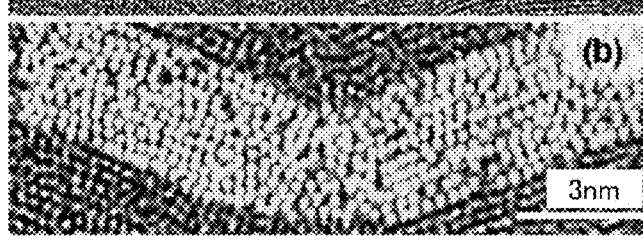

FIG. 16A is a cross-sectional TEM image of a CAAC-OS film. FIG. 16B is a cross-sectional TEM image obtained by enlarging the image of FIG. 16A. In FIG. 16B, atomic arrangement is highlighted for easy understanding.

Figure 16C:
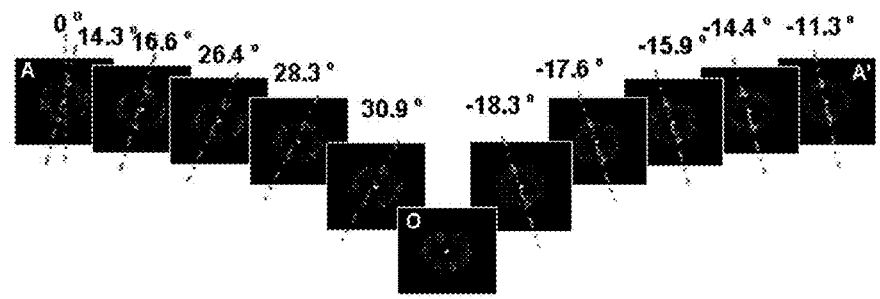

FIG. 16C is local Fourier transform images of regions each surrounded by a circle (the diameter is approximately 4 nm) between A and O and between O and A' in FIG. 16A. C-axis alignment can be observed in each region in FIG. 16C. The c-axis direction between A and O is different from that between O and A', which indicates that a grain in the region between A and O is different from that between O and A'. In addition, the angle of the c-axis between A and O continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS film, spots (bright spots) indicating alignment are shown. For example, when electron diffraction with an electron beam having a diameter of 1 nm to 30 nm (such electron diffraction is also referred to as nanobeam electron diffraction) is performed on the top surface of the CAAC-OS film, spots are observed (see FIG. 17A).

From the results of the cross-sectional TEM image and the plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 $\mu$m$^2$ or more, or 1000 $\mu$m$^2$ or more is observed in some cases in the plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray is incident on a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS film, a region to which the impurity is added may be altered and the proportion of the c-axis aligned crystal parts in the CAAC-OS film might vary depending on regions.

Note that when the CAAC-OS film with an InGaZnO$_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In an image of the nc-OS film which is obtained with the TEM, for example, a grain boundary is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Furthermore, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases (see FIG. 17B).

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where an oxide semiconductor film has a plurality of structures, the structures can be analyzed using nanobeam electron diffraction in some cases.

Figure 17A:
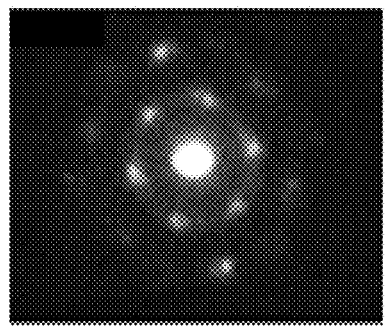
FIGS. 17A and 17B show nanobeam electron diffraction patterns of oxide semiconductor films.
Figure 17B:
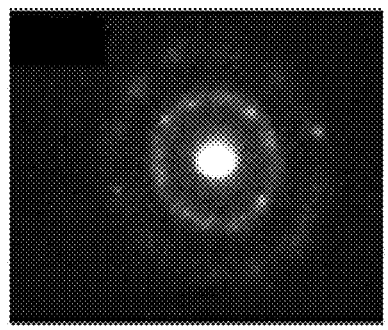
Figure 17C:
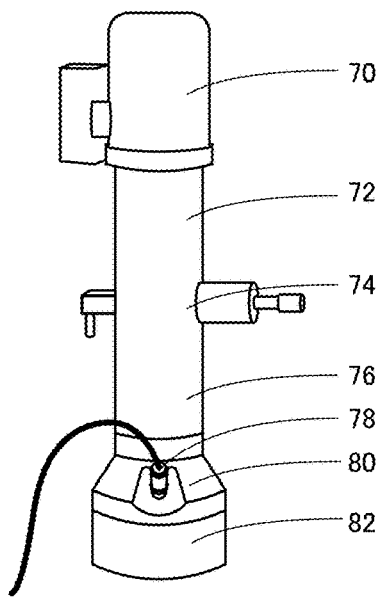
FIGS. 17C and 17D show an example of a transmission electron diffraction measurement apparatus.

FIG. 17C illustrates a transmission electron diffraction measurement apparatus which includes an electron gun chamber 70, an optical system 72 below the electron gun chamber 70, a sample chamber 74 below the optical system 72, an optical system 76 below the sample chamber 74, an observation chamber 80 below the optical system 76, a camera 78 installed in the observation chamber 80, and a film chamber 82 below the observation chamber 80. The camera 78 is provided to face toward the inside of the observation chamber 80. Note that the film chamber 82 is not necessarily provided.

Figure 17D:
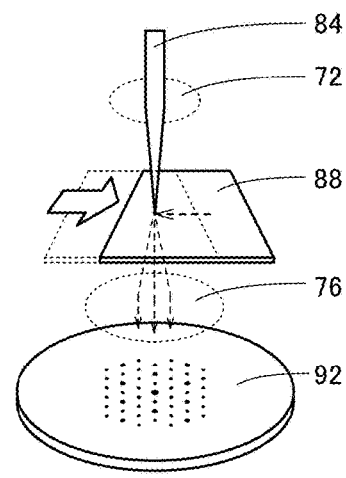

FIG. 17D illustrates an internal structure of the transmission electron diffraction measurement apparatus illustrated in FIG. 17C. In the transmission electron diffraction measurement apparatus, a substance 88 which is positioned in the sample chamber 74 is irradiated with electrons emitted from an electron gun installed in the electron gun chamber 70 through the optical system 72. Electrons passing through the substance 88 are incident on a fluorescent plate 92 provided in the observation chamber 80 through the optical system 76. On the fluorescent plate 92, a pattern corresponding to the intensity of the incident electrons appears, which allows measurement of a transmission electron diffraction pattern.

The camera 78 is installed so as to face the fluorescent plate 92 and can take an image of a pattern appearing on the fluorescent plate 92. An angle formed by a straight line which passes through the center of a lens of the camera 78 and the center of the fluorescent plate 92 and an upper surface of the fluorescent plate 92 is, for example, 15° or more and 80° or less, 30° or more and 75° or less, or 45° or more and 70° or less. As the angle is reduced, distortion of the transmission electron diffraction pattern taken by the camera 78 becomes larger. Note that if the angle is obtained in advance, the distortion of an obtained transmission electron diffraction pattern can be corrected. Note that the film chamber 82 may be provided with the camera 78. For example, the camera 78 may be set in the film chamber 82 so as to be opposite to the incident direction of electrons 84. In this case, a transmission electron diffraction pattern with less distortion can be taken from the rear surface of the fluorescent plate 92.

A holder for fixing the substance 88 that is a sample is provided in the sample chamber 74. The holder transmits electrons passing through the substance 88. The holder may have, for example, a function of moving the substance 88 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 88.

Then, a method for measuring a transmission electron diffraction pattern of a substance by the transmission electron diffraction measurement apparatus described above will be described.

For example, changes in the structure of a substance can be observed by changing the irradiation position of the electrons 84 on the substance (also referred to as scanning) as illustrated in FIG. 17D, in which the electrons 84 are a nanobeam. At this time, when the substance 88 is a CAAC-OS film, a diffraction pattern shown in FIG. 17A is observed. When the substance 88 is an nc-OS film, a diffraction pattern shown in FIG. 17B is observed.

Even when the substance 88 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high-quality CAAC-OS film, for example, the proportion of CAAC is higher than or equal to 50%, preferably higher than or equal to 80%, more preferably higher than or equal to 90%, and still more preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 18A:
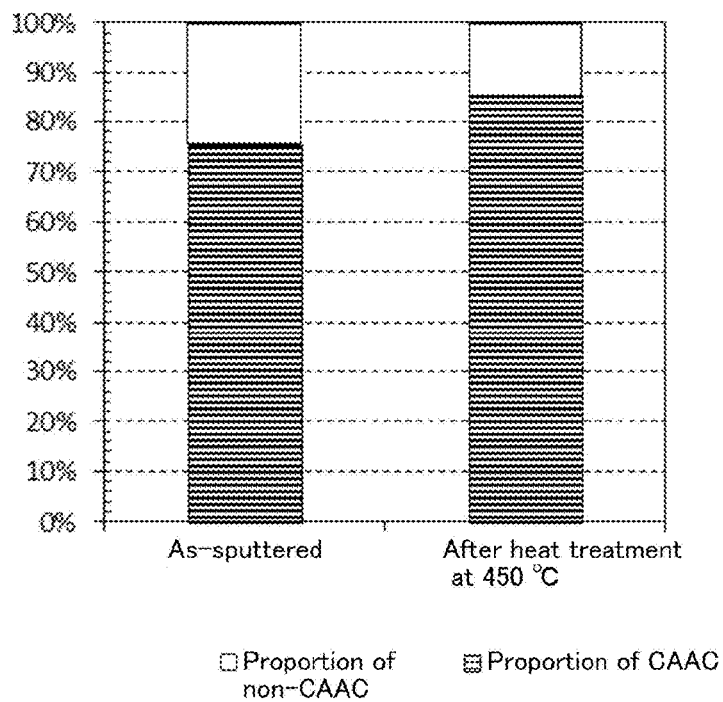
FIG. 18A shows an example of structural analysis by transmission electron diffraction measurement.

FIG. 18A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%).

These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 18B:
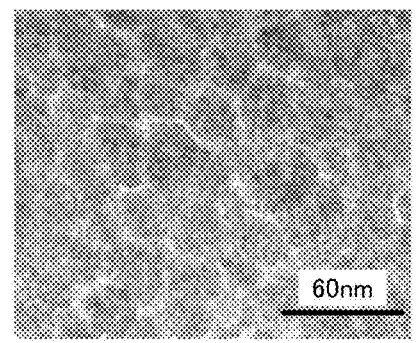
FIGS. 18B and 18C show plan-view TEM images.
Figure 18C:
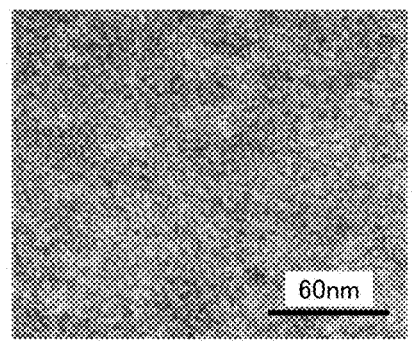

FIGS. 18B and 18C are plan-view TEM images of the CAAC-OS film obtained just after the deposition and the CAAC-OS film subjected to the heat treatment at 450° C., respectively. Comparison between FIGS. 18B and 18C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be combined as appropriate with any of the structures, methods, and the like described in the other embodiments.

Embodiment 5

In this embodiment, an example of a cross-sectional structure of a transistor used in a semiconductor device of one embodiment of the disclosed invention will be described with reference to drawings.

Figure 19:
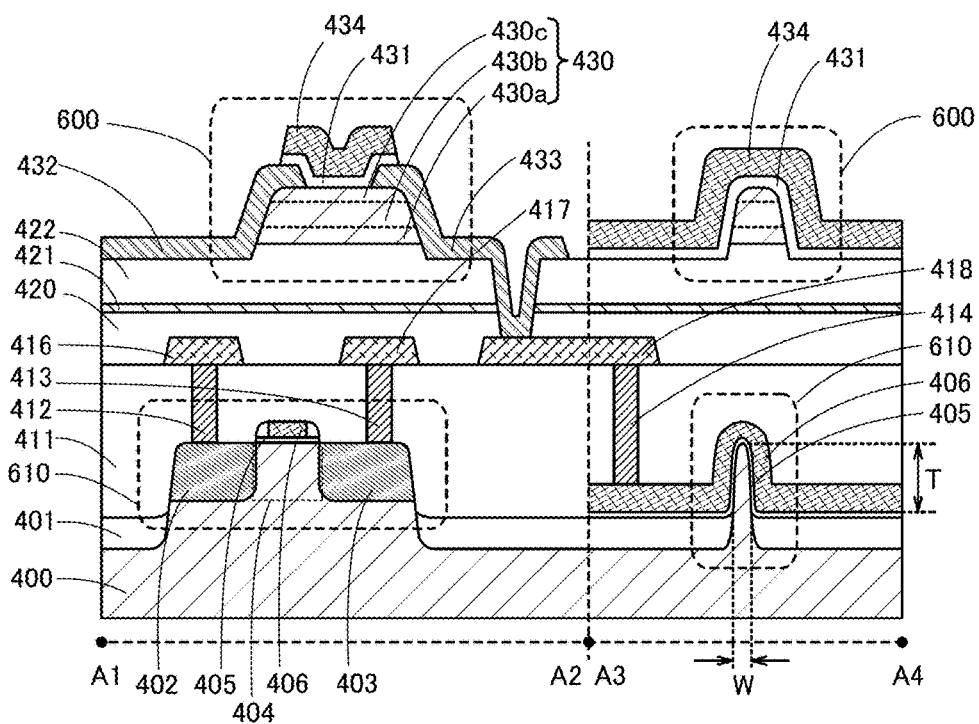
FIG. 19 is a cross-sectional view showing one embodiment of the present invention.

FIG. 19 shows an example of part of a cross-sectional structure of a circuit portion according to one embodiment of the invention. Note that FIG. 19 shows an example of a cross-sectional structure of the transistor 600 and the transistor 610 which are shown in FIG. 7 in Embodiment 3. A region along dashed line A1-A2 shows a structure of the transistors 600 and 610 in the channel length direction, and a region along dashed line A3-A4 shows a structure of the transistors 600 and 610 in the channel width direction. Note that in one embodiment of the present invention, the channel length direction of the transistor 600 is not necessarily the same as the channel length direction of the transistor 610.

The channel length direction refers to a direction in which a carrier moves between a pair of impurity regions functioning as a source region and a drain region by the most direct way, and the channel width direction refers to a direction perpendicular to the channel length direction.

In FIG. 19, the transistor 600 including a channel formation region in an oxide semiconductor film is formed over the transistor 610 including a channel formation region in a single crystal silicon substrate.

The transistor 610 may include the channel formation region in a semiconductor film or a semiconductor substrate of silicon, germanium, or the like in an amorphous, microcrystalline, polycrystalline, or single crystal state. Alternatively, the transistor 610 may include the channel formation region in an oxide semiconductor film or an oxide semiconductor substrate. In the case where channel formation regions of all the transistors are included in an oxide semiconductor film or an oxide semiconductor substrate, the transistor 600 is not necessarily stacked over the transistor 610, and the transistors 600 and 610 may be formed in the same layer.

In the case where the transistor 610 is formed using a thin silicon film, any of the following can be used for the thin film: amorphous silicon formed by a sputtering method or a vapor phase growth method such as a plasma CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor 610 is formed can be, for example, a silicon substrate, a germanium substrate, or a silicon germanium substrate. In FIG. 19, a single crystal silicon substrate is used as the substrate 400.

The transistor 610 is electrically isolated by an element isolation method. As the element isolation method, a trench isolation method (a shallow trench isolation (STI) method) or the like can be used. FIG. 19 shows an example where the trench isolation method is used to electrically isolate the transistor 610. Specifically, in FIG. 19, the transistor 610 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 610 and a channel formation region 404 placed between the impurity regions 402 and 403 are provided. Furthermore, the transistor 610 includes an insulating film 405 covering the channel formation region 404 and a gate electrode 406 that overlaps with the channel formation region 404 with the insulating film 405 provided therebetween.

In the transistor 610, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor 610 can be reduced, and the number of transferred carriers in the transistor 610 can be increased. As a result, the on-state current and field-effect mobility of the transistor 610 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 610 can be further increased and the field-effect mobility of the transistor 610 can be further increased.

Note that when the transistor 610 is formed using a bulk semiconductor substrate, the aspect ratio is preferably 0.5 or more, more preferably 1 or more.

An insulating film 411 is provided over the transistor 610. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor 600 is provided over the insulating film 422.

The transistor 600 includes, over the insulating film 422, a semiconductor film 430 including an oxide semiconductor, conductive films 432 and 433 functioning as a source and drain electrodes and electrically connected to the semiconductor film 430, a gate insulating film 431 covering the semiconductor film 430, and a gate electrode 434 overlapping with the semiconductor film 430 with the gate insulating film 431 positioned therebetween. Note that an opening is formed in the insulating films 420 to 422. The conductive film 433 is connected to the conductive film 418 in the opening.

Note that in FIG. 19, the transistor 600 includes at least the gate electrode 434 on one side of the semiconductor film 430, and may further include a gate electrode overlapping with the semiconductor film 430 with the insulating film 422 positioned therebetween.

In the case where the transistor 600 has a pair of gate electrodes, one of the gate electrodes may be supplied with a signal for controlling the on/off state, and the other of the gate electrodes may be supplied with a potential from another element. In that case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 19, the transistor 600 has a single-gate structure where one channel formation region corresponding to one gate electrode 434 is provided. However, the transistor 600 may have a multi-gate structure where a plurality of electrically connected gate electrodes are provided so that a plurality of channel formation regions are included in one active layer.

FIG. 19 shows an example in which the semiconductor film 430 included in the transistor 600 includes oxide semiconductor films 430a to 430c that are stacked in this order over the insulating film 422. Note that in one embodiment of the present invention, the semiconductor film 430 of the transistor 600 may be formed using a single-layer metal oxide film.

The insulating film 422 preferably has a function of supplying part of oxygen to the oxide semiconductor films 430a to 430c by heating. Alternatively, it is preferable that the number of defects in the insulating film 422 be small, and typically the spin density at g=2.001 due to a dangling bond of silicon be lower than or equal to $1 \times 10^{18}$ spins/cm$^3$. The spin density is measured by electron spin resonance (ESR) spectroscopy.

The insulating film 422, which has a function of supplying part of the oxygen to the oxide semiconductor films 430a to 430c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 600 shown in FIG. 19, the gate electrode 434 overlaps with end portions of the oxide semiconductor film 430b including a channel region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, it can be considered that, in the end portions of the oxide semiconductor film, oxygen bonded to the metal element is easily released, so that an oxygen vacancy is easily formed; thus, the end portions of the oxide semiconductor film easily has n-type conductivity. However, an electric field applied to the end portions can be controlled by controlling the potential of the gate electrode 434 because the end portions of the oxide semiconductor film 430b that do not overlap with the conductive films 432 and 433 overlap with the gate electrode 434 in the transistor 600 in FIG. 19. Consequently, current that flows between the conductive films 432 and 433 through the end portions of the oxide semiconductor film 430b can be controlled by the potential applied to the gate electrode 434. Such a structure of the transistor 600 is referred to as a surrounded channel (s-channel) structure.

With the s-channel structure, specifically, when a potential at which the transistor 600 is turned off is supplied to the gate electrode 434, the amount of off-state current that flows between the conductive films 432 and 433 through the end portions can be reduced. For this reason, in the transistor 600, even when the distance between the conductive films 432 and 433 at the end portions of the oxide semiconductor film 430b is reduced as a result of reducing the channel length to obtain high on-state current, the transistor 600 can have a low off-state current. Consequently, with the short channel length, the transistor 600 can have a high on-state current when in an on state and a low off-state current when in an off state.

With the s-channel structure, specifically, when a potential at which the transistor 600 is turned on is supplied to the gate electrode 434, the amount of current that flows between the conductive films 432 and 433 through the end portions of the oxide semiconductor film 430b can be increased. The current contributes to an increase in the field-effect mobility and the on-state current of the transistor 600. When the end portions of the oxide semiconductor film 430b overlap with the gate electrode 434, carriers flow in a wide region of the oxide semiconductor film 430b without being limited to a region in the vicinity of the interface between the oxide semiconductor film 430b and the gate insulating film 431, which results in an increase in the amount of carrier movement in the transistor 600. As a result, the on-state current of the transistor 600 is increased, and the field-effect mobility is increased to greater than or equal to 10 cm$^2$/V·s or to greater than or equal to 20 cm$^2$V/·s, for example. Note that here, the field-effect mobility is not an approximate value of the mobility as the physical property of the oxide semiconductor film but is the apparent field-effect mobility in a saturation region of the transistor, which is an index of current drive capability.

Figure 20:
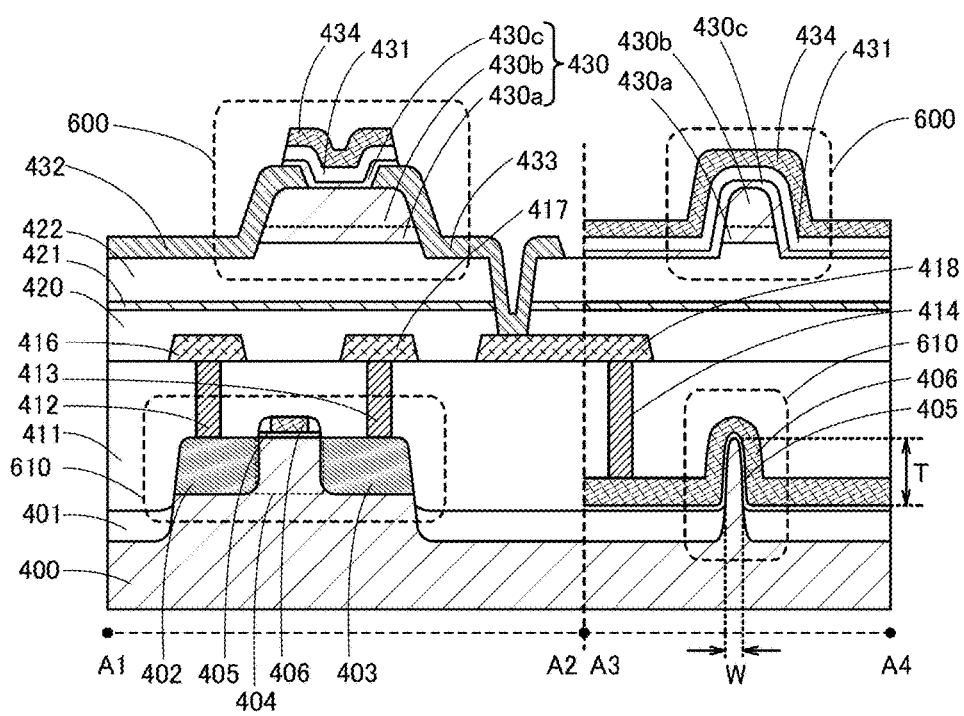
FIG. 20 is a cross-sectional view showing one embodiment of the present invention.

Although this embodiment is described with reference to FIG. 19, one embodiment of the present invention is not limited to this structure. For example, a structure shown in FIG. 20 may be employed.

Note that the structures, methods, and the like described in this embodiment can be combined as appropriate with any of the structures, methods, and the like described in the other embodiments.

Embodiment 6

Although the conductive films and the semiconductor films which are described in the above embodiments can be formed by a sputtering method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The conductive films and the semiconductor films which are described in the above embodiments can be formed by a thermal CVD method such as a MOCVD method or an ALD method. For example, in the case where an $InGaZnO_X$ (X>0) film is formed, trimethylindium, trimethylgallium, and dimethylzinc are used. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium and diethylzinc (chemical formula: $(C_2H_5)_2Zn$) can be used instead of dimethylzinc.

For example, in the case where a tungsten film is formed using a deposition apparatus employing ALD, a $WF_6$ gas and a $B_2H_6$ gas are sequentially introduced a plurality of times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an $InGaZnO_X$ (X>0) film is formed using a deposition apparatus employing ALD, an $In(CH_3)_3$ gas and an $O_3$ gas are sequentially introduced a plurality of times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, a GaInO layer, a ZnInO layer or a GaZnO layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ gas may be used. Furthermore, a $Zn(CH_3)_2$ gas may be used.

The structure described in this embodiment can be combined as appropriate with any of the structures described in the other embodiments.

Embodiment 7

In this embodiment, application examples of the semiconductor device, which is described in the above embodiments and has a function as a PLD, to an electronic component and to an electronic device including the electronic component will be described with reference to FIGS. 21A and 21B and FIGS. 22A to 22E.

Figure 21A:
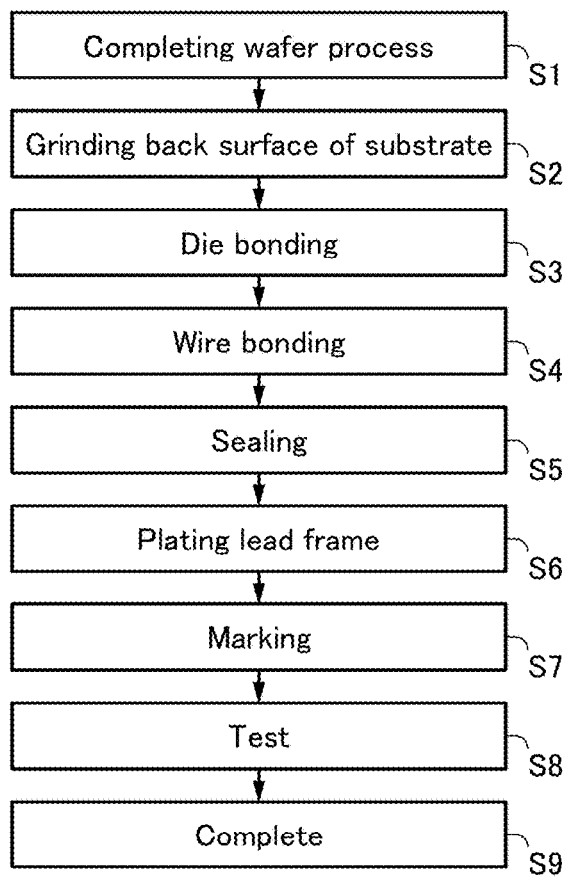
FIG. 21A is a flowchart showing a manufacturing process of an electronic component.

FIG. 21A shows an example where the semiconductor device described in the above embodiments and having a function as a PLD is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A circuit portion including the transistors shown in FIG. 19 of Embodiment 5 is completed by integrating detachable components on a printed circuit board through an assembly process (post-process).

The post-process can be completed through steps shown in FIG. 21A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate and separating the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, a chip may be mounted on and bonded to an interposer.

Next, wire bonding for electrically connecting a lead of the lead frame and an electrode on a chip through a metal wire is performed (Step S4). As the metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the mounted circuit portion and wire can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component that includes the circuit portion including the PLD is completed (Step S9).

The aforementioned electronic component includes the semiconductor device described in the above embodiments and having a function as a PLD. Therefore, the electronic component has reduced power consumption and improved reliability.

Figure 21B:
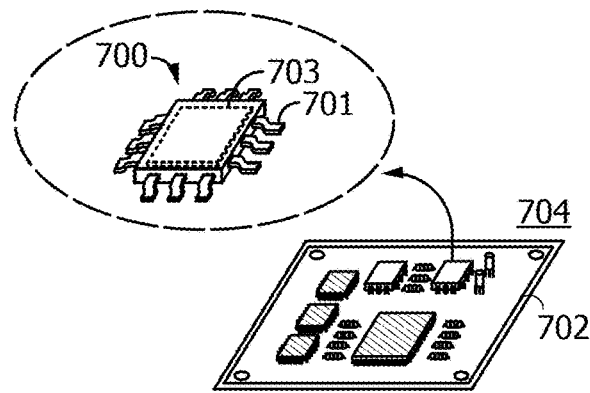
FIG. 21B is a schematic perspective view of the electronic component.

FIG. 21B is a perspective schematic diagram of a completed electronic component. FIG. 21B shows a perspective schematic diagram of a quad flat package (QFP) as an example of the electronic component. An electronic component 700 shown in FIG. 21B includes a lead 701 and a circuit portion 703. The electronic component 700 in FIG. 21B is, for example, mounted on a printed circuit board 702. A plurality of electronic components 700 are used in combination and electrically connected to each other over the printed wiring board 702; thus, a circuit board 704 on which the electronic components are mounted is completed. The completed circuit board 704 is provided in an electronic device or the like.

Next, description is made on applications of the above electronic component to electronic devices such as a computer, a portable information terminal (including a mobile phone, a portable game machine, and an audio reproducing device), electronic paper, a television device (also referred to as television or television receiver), and a digital video camera.

Figure 22A:
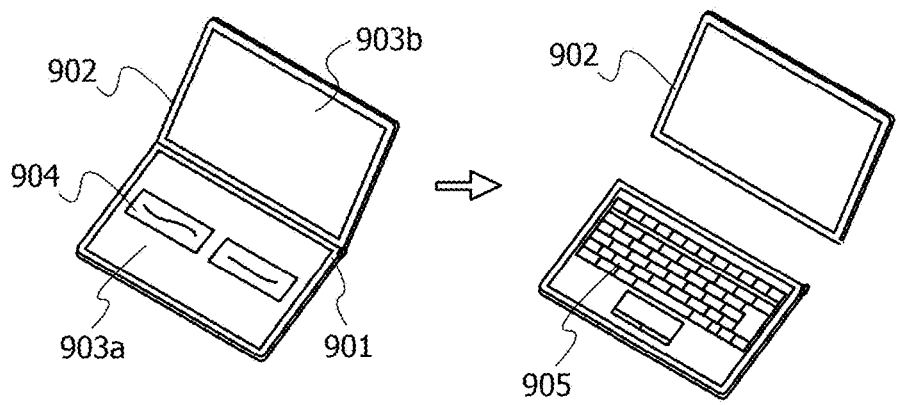
FIGS. 22A to 22E are electronic devices using electronic components.

FIG. 22A illustrates a portable information terminal that includes a housing 901, a housing 902, a first display portion 903a, a second display portion 903b, and the like. At least one of the housings 901 and 902 includes an electronic component provided with the semiconductor device having a function as a PLD shown in the above embodiments. It is thus possible to obtain a portable information terminal with reduced power consumption and improved reliability.

Note that the first display portion 903a is a panel having a touch input function, and for example, as illustrated in the left of FIG. 22A, which of "touch input" and "keyboard input" is performed can be selected by a selection button 904 displayed on the first display portion 903a. Since selection buttons with a variety of sizes can be displayed, the information terminal can be easily used by people of any generation. For example, when "keyboard input" is selected, a keyboard 905 is displayed on the first display portion 903a as illustrated in the right of FIG. 22A. Thus, letters can be input quickly by key input as in the case of using a conventional information terminal, for example.

One of the first display portion 903a and the second display portion 903b can be detached from the portable information terminal shown in the right of FIG. 22A. Providing the second display portion 903b with a touch input function makes the information terminal convenient to carry because the weight can be further reduced and the information terminal can operate with one hand while the other hand supports the housing 902.

The portable information terminal in FIG. 22A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing. Furthermore, an external connection terminal (e.g., an earphone terminal or a USB terminal), a recording medium insertion portion, and the like may be provided on the back surface or the side surface of the housing.

The portable information terminal illustrated in FIG. 22A may transmit and receive data wirelessly. Through wireless communication, desired book data or the like can be purchased and downloaded from an e-book server.

In addition, the housing 902 illustrated in FIG. 22A may be equipped with an antenna, a microphone function, or a wireless communication function to be used as a mobile phone.

Figure 22B:
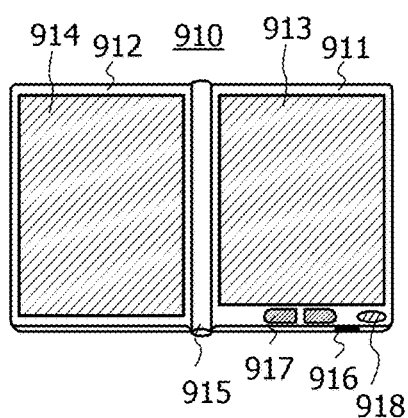

FIG. 22B illustrates an e-book reader 910 in which electronic paper is incorporated. The e-book reader 910 has two housings of a housing 911 and a housing 912. The housing 911 and the housing 912 are provided with a display portion 913 and a display portion 914, respectively. The housings 911 and 912 are connected by a hinge 915 and can be opened or closed with the hinge 915 as an axis. The housing 911 is provided with a power switch 916, an operation key 917, a speaker 918, and the like. At least one of the housings 911 and 912 includes an electronic component provided with the semiconductor device having a function as a PLD. It is thus possible to obtain an e-book reader with reduced power consumption and improved reliability.

Figure 22C:
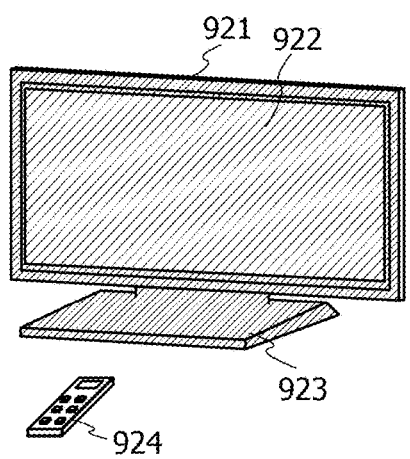

FIG. 22C illustrates a television device including a housing 921, a display portion 922, a stand 923, and the like. The television device 920 can operate with a switch of the housing 921 and a separate remote controller 924. The housing 921 and the remote controller 924 include an electronic component provided with the semiconductor device having a function as a PLD shown in the above embodiments. It is thus possible to obtain a television device with reduced power consumption and improved reliability.

Figure 22D:
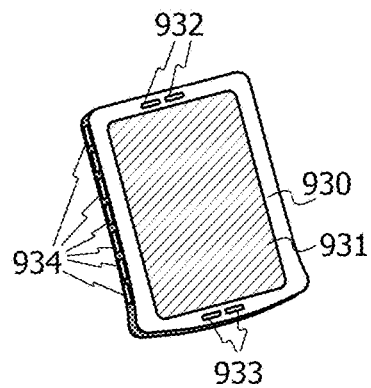

FIG. 22D illustrates a smartphone in which a main body 930 includes a display portion 931, a speaker 932, a microphone 933, an operation key 934, and the like. The main body 930 includes an electronic component provided with the semiconductor device having a function as a PLD shown in the above embodiments. It is thus possible to obtain a smartphone with reduced power consumption and improved reliability.

Figure 22E:
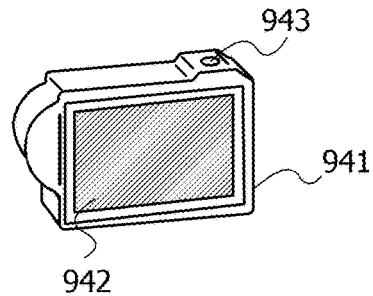

FIG. 22E illustrates a digital camera including a main body 941, a display portion 942, an operation switch 943, and the like. The main body 941 includes an electronic component provided with the semiconductor device having a function as a PLD shown in the above embodiments. It is thus possible to obtain a smartphone with reduced power consumption and improved reliability.

As described above, the electronic devices shown in this embodiment each include an electronic component provided with the semiconductor device having a function as a PLD shown in the above embodiments. It is thus possible to obtain an electronic device with reduced power consumption and improved reliability.

This application is based on Japanese Patent Application serial No. 2013-241441 filed with Japan Patent Office on Nov. 22, 2013, the entire contents of which are hereby incorporated by reference.

What is claimed is:

1. A semiconductor device comprising:
a programmable circuit;
a monitor circuit comprising a node, a first transistor, and a first capacitor; and
a controller,
wherein the programmable circuit comprises:
    a programmable switch element comprising a first configuration memory; and
    a programmable logic element comprising a second configuration memory,
wherein one of a source and a drain of the first transistor is electrically connected to the node,
wherein the node is electrically connected to the first capacitor,
wherein the monitor circuit is configured to monitor a potential of the node and output a first signal representing a change of the potential of the node to the controller,
wherein the controller is configured to output a second signal in accordance with the first signal, and
wherein each of the first configuration memory and the second configuration memory is reconfigured in accordance with the second signal.

2. The semiconductor device according to claim 1
wherein the monitor circuit further comprises a second transistor, a third transistor and a flip-flop,
wherein a gate of the second transistor is electrically connected to the node,
wherein one of a source and a drain of the second transistor is electrically connected to one of a source and a drain of the third transistor,
wherein the other of the source and the drain of the third transistor is electrically connected to the flip-flop, wherein a clock signal is input to a gate of the third transistor, and wherein the first signal is output from an output of the flip-flop.

3. A semiconductor device comprising:

a programmable circuit;

a monitor circuit comprising a node, a first transistor, and a first capacitor;

a controller; and a memory device, wherein the programmable circuit comprises:
  a programmable switch element comprising a first configuration memory; and
  a programmable logic element comprising a second configuration memory, wherein one of a source and a drain of the first transistor is electrically connected to the node, wherein the node is electrically connected to the first capacitor, wherein the monitor circuit is configured to monitor a potential of the node and output a signal representing a change of the potential of the node to the controller, and wherein the controller is configured to read a configuration data stored in the memory device in accordance with the signal.

4. The semiconductor device according to claim 3, wherein the programmable switch element or the programmable logic element comprises a fourth transistor and a second capacitor, and wherein the fourth transistor is electrically connected to the capacitor.

5. The semiconductor device according to claim 4, wherein the fourth transistor comprises a channel formation region in an oxide semiconductor film.

6. The semiconductor device according to claim 4, wherein the fourth transistor comprises a channel formation region in an oxide semiconductor film, and wherein the oxide semiconductor film comprises In, Ga, and Zn.

7. The semiconductor device according to claim 3 wherein the monitor circuit further comprises a second transistor, a third transistor and a flip-flop, wherein a gate of the second transistor is electrically connected to the node, wherein one of a source and a drain of the second transistor is electrically connected to one of a source and a drain of the third transistor, wherein the other of the source and the drain of the third transistor is electrically connected to the flip-flop, wherein a clock signal is input to a gate of the third transistor, and wherein the signal is output from an output of the flip-flop.

8. A semiconductor device comprising:

a programmable circuit comprising:
  a first transistor; and
  a first capacitor;

a monitor circuit comprising:
  a node;
  a second transistor; and
  a second capacitor;

a controller; and a memory device, wherein the programmable circuit comprises:
  a programmable switch element comprising a first configuration memory; and
  a programmable logic element comprising a second configuration memory, wherein the monitor circuit is configured to monitor a potential of the node and output a first signal representing a change of the potential of the node to the controller, wherein the controller is configured to read a configuration data stored in the memory device in accordance with the first signal, wherein the first transistor is electrically connected to the first capacitor, and wherein the second transistor is electrically connected to the second capacitor at the node.

9. The semiconductor device according to claim 8, wherein the first transistor and the second transistor each comprise a channel formation region in an oxide semiconductor film.

10. The semiconductor device according to claim 8, wherein the first transistor and the second transistor each comprise a channel formation region in an oxide semiconductor film, and wherein the oxide semiconductor film comprises In, Ga, and Zn.

11. The semiconductor device according to claim 8, wherein a capacitance of the second capacitor is lower than that of the first capacitor.

12. The semiconductor device according to claim 8, wherein the first transistor comprises a first oxide semiconductor film, wherein the second transistor comprises a second oxide semiconductor film, and wherein the first oxide semiconductor film and the second oxide semiconductor film are in the same layer.

13. The semiconductor device according to claim 8, wherein the monitor circuit comprises:

a first p-channel transistor comprising a gate supplied with an inverted signal of a first clock signal and a source and a drain one of which is supplied with a high power source potential;

a second p-channel transistor comprising a gate supplied with the first clock signal and a source and a drain one of which is electrically connected to the other of the source and the drain of the first p-channel transistor;

a first n-channel transistor comprising a gate supplied with the first clock signal and a source and a drain one of which is electrically connected to the other of the source and the drain of the second p-channel transistor;

a second n-channel transistor comprising a gate electrically connected to one of a source and a drain of the second transistor and the source and the drain one of which is electrically connected to the other of the source and the drain of the first n-channel transistor; and a flip-flop to which the high power source potential is supplied, the flip-flop being electrically connected to the other of the source and the drain of the second p-channel transistor or the one of the source and the drain of the first n-channel transistor.

14. The semiconductor device according to claim 13, wherein the first p-channel transistor, the second p-channel transistor, the first n-channel transistor, and the second n-channel transistor each comprise a channel formation region in a silicon semiconductor film.

15. The semiconductor device according to claim 13,
wherein the first transistor and the second transistor are over the first p-channel transistor, the second p-channel transistor, the first n-channel transistor, and the second n-channel transistor.

16. The semiconductor device according to claim 13,
wherein the first transistor and the second transistor each comprise a channel formation region in an oxide semiconductor film.

17. The semiconductor device according to claim 13,
wherein the first transistor and the second transistor each comprise a channel formation region in an oxide semiconductor film, and
wherein the oxide semiconductor film comprises In, Ga, and Zn.

* * * * *

UNITED STATES PATENT AND TRADEMARK OFFICE
CERTIFICATE OF CORRECTION

PATENT NO. : 9,755,648 B2
APPLICATION NO. : 14/542874
DATED : September 5, 2017
INVENTOR(S) : Munehiro Kozuma It is certified that error appears in the above-identified patent and that said Letters Patent is hereby corrected as shown below:

Column 33, Line 32, in Claim 4, before "capacitor." insert --second--.

Signed and Sealed this
Third Day of July, 2018

Andrei Iancu
*Director of the United States Patent and Trademark Office*